United States Patent
Eden et al.

(10) Patent No.: US 6,710,441 B2
(45) Date of Patent: Mar. 23, 2004

(54) POWER SEMICONDUCTOR SWITCHING DEVICES, POWER CONVERTERS, INTEGRATED CIRCUIT ASSEMBLIES, INTEGRATED CIRCUITRY, POWER CURRENT SWITCHING METHODS, METHODS OF FORMING A POWER SEMICONDUCTOR SWITCHING DEVICE, POWER CONVERSION METHODS, POWER SEMICONDUCTOR SWITCHING DEVICE PACKAGING METHODS, AND METHODS OF FORMING A POWER TRANSISTOR

(75) Inventors: Richard C. Eden, Briarcliff, TX (US); Bruce A. Smetana, Colton, WA (US)

(73) Assignee: Isothermal Research Systems, Inc., Clarkston, WA (US)

( * ) Notice: Subject to any disclaimer, the term of this patent is extended or adjusted under 35 U.S.C. 154(b) by 0 days.

(21) Appl. No.: 09/904,578

(22) Filed: Jul. 12, 2001

(65) Prior Publication Data

US 2002/0076851 A1 Jun. 20, 2002

Related U.S. Application Data

(60) Provisional application No. 60/217,860, filed on Jul. 13, 2000.

(51) Int. Cl.$^7$ .......................... H01L 23/04; H01L 29/76; H01L 29/94; H01L 31/062; H01L 31/113
(52) U.S. Cl. ....................... 257/698; 257/341; 257/343; 257/401
(58) Field of Search ................................ 257/341, 343, 257/401, 698

(56) References Cited

U.S. PATENT DOCUMENTS 4,175,240 A   11/1979   Kremlev et al.
4,256,977 A    3/1981   Hendrickson (List continued on next page.)

FOREIGN PATENT DOCUMENTS

JP            406260927 A    9/1994

OTHER PUBLICATIONS

Design of Pulse Width Modulation Based Smart Switch Controller for Automotive Application; Athalye et al.; 10/99; pp. 8.C.1–1–1–7.

"Analysis and Implementation of a Semi–integrated Buck Converter with Static Feedback Control"; Strandberg et al.; Jun. 29, 1999; 4 pp.

"Role of Semiconductor Devices in Portable Electronics Power Management"; Mohamed Darwish; Aug. 9, 2000; 4 pp.

(List continued on next page.)

*Primary Examiner*—Ngân V. Ngô
(74) *Attorney, Agent, or Firm*—Wells St. John, P.S.

(57) ABSTRACT

Power semiconductor switching devices, power converters, integrated circuit assemblies, integrated circuitry, power current switching methods, methods of forming a power semiconductor switching device, power conversion methods, power semiconductor switching device packaging methods, and methods of forming a power transistor are described. One exemplary aspect provides an integrated circuit assembly including a semiconductive substrate comprising a plurality of field effect transistors having electrically coupled sources and electrically coupled drains comprising regions of the substrate adjacent to a surface of the substrate, and wherein the electrically coupled sources and the electrically coupled drains are collectively configured to conduct power currents in excess of one Ampere; and a package having a plurality of source contacts and a plurality of drain contacts configured to couple with the electrically coupled sources and the electrically coupled drains of the semiconductive substrate, and wherein the source contacts and the drain contacts are provided adjacent to the surface of the package.

50 Claims, 15 Drawing Sheets

U.S. PATENT DOCUMENTS

| | | |
|---|---|---|
| 4,462,041 A | 7/1984 | Glenn |
| 4,710,349 A * | 12/1987 | Yamazaki et al. .......... 420/495 |
| 4,794,441 A | 12/1988 | Sugawara et al. |
| 4,955,790 A * | 9/1990 | Nakanishi et al. ............ 417/45 |
| 5,038,194 A * | 8/1991 | Takahama ................... 257/773 |
| 5,143,865 A * | 9/1992 | Hideshima et al. ......... 438/614 |
| 5,148,064 A | 9/1992 | Kevorkian et al. |
| 5,298,797 A | 3/1994 | Redl |
| 5,470,795 A * | 11/1995 | Shushurin .................. 438/107 |
| 5,479,089 A | 12/1995 | Lee |
| 5,479,117 A | 12/1995 | Gabara |
| 5,493,275 A * | 2/1996 | Easter ..................... 340/572.3 |
| 5,532,179 A | 7/1996 | Chang et al. |
| 5,548,150 A | 8/1996 | Omura et al. |
| 5,608,616 A | 3/1997 | Umeda et al. |
| 5,652,183 A | 7/1997 | Fujii |
| 5,726,872 A | 3/1998 | Vinciarelli et al. |
| 5,728,594 A | 3/1998 | Efland et al. |
| 5,736,766 A | 4/1998 | Efland et al. |
| 5,744,843 A | 4/1998 | Efland et al. |
| 5,777,383 A | 7/1998 | Stager et al. |
| 5,859,456 A | 1/1999 | Efland et al. |
| 5,900,764 A | 5/1999 | Imam et al. |
| 5,910,669 A | 6/1999 | Chang et al. |
| 5,946,202 A | 8/1999 | Balogh |
| 5,969,513 A | 10/1999 | Clark |
| 5,973,367 A | 10/1999 | Williams |
| 6,020,729 A | 2/2000 | Stratakos et al. |
| 6,023,155 A | 2/2000 | Kalinsky et al. |
| 6,031,361 A | 2/2000 | Burstein et al. |
| 6,097,064 A | 8/2000 | Saitoh et al. |
| 6,100,583 A | 8/2000 | Ohmori |
| 6,100,676 A | 8/2000 | Burstein et al. |
| 6,114,726 A | 9/2000 | Barkhordarian |
| 6,150,150 A | 11/2000 | Livi et al. |
| 6,150,722 A | 11/2000 | Efland et al. |
| 6,160,441 A | 12/2000 | Stratakos et al. |
| 6,198,261 B1 | 3/2001 | Schultz et al. |
| 6,225,795 B1 | 5/2001 | Stratakos et al. |
| 6,268,716 B1 | 7/2001 | Burstein et al. |
| 6,271,651 B1 | 8/2001 | Stratakos et al. |
| 6,278,264 B1 | 8/2001 | Burstein et al. |
| 6,288,919 B1 | 9/2001 | Jain |
| 6,329,801 B1 | 12/2001 | Zuniga et al. |
| 6,351,108 B1 | 2/2002 | Burstein et al. |
| 6,404,173 B1 | 6/2002 | Telefus |
| 6,421,262 B1 | 7/2002 | Saxelby et al. |
| 6,462,521 B1 | 10/2002 | Yang et al. |
| 6,462,522 B2 | 10/2002 | Burstein et al. |
| 6,476,442 B1 | 11/2002 | Williams et al. |
| 6,476,443 B1 | 11/2002 | Kinzer |
| 2001/0035746 A1 | 11/2001 | Burnstein et al. |
| 2001/0038277 A1 | 11/2001 | Burnstein et al. |
| 2002/0104872 A1 * | 8/2002 | DeFelice et al. ............ 228/103 |

OTHER PUBLICATIONS

"Motorola to Preview Next–generation Smart Power Technology at World's Leading Power Conference"; http://www.apspg.com/procs/060100/smart.html; Jun. 29, 2001; 2 pp.

"IEAI204T: High Efficiency DC/DC Converter"; http://www.semiconductors.philips.com/pip/teal204t.html; Jun. 29, 2001: 3 pp.

"Synchronous Rectification with Adaptive Timing Control"; Ackes et al.: 06/95: pp. 88–95.

"High–Efficiency Low–Voltage DC–DC Conversion for Portable Applications"; Stratakos; The 12th International Symposium on Power Semiconductor Devices & ICs; 1998; pp. 1–245.

"A Low Voltage CMOS Compatible Power MOSFET for On–Chip Dynamic Voltage Scaling DC–DC Converters" Nassif–Khalil et al.; Jan. 2000; pp. 43–46.

"FlipFET™ MOSFET Design for High Volume SMT Assembly"; Schofield et al. ; http://www.isf.com/technical–info/papers.html; Mar. 18, 2001; 6 pp.

"Active Clamp Circuits for Switchmode Regulators Supplying Microprocessor Ioada" Sauders et al.; May 1997; pp. 1179–1185.

"An Active Clamp Circuit for Voltage Regulation Module (VRM) Applications"; Wu et al.; IEEE Transactions on Power Electronics, vol. 16, No. 5; Sep. 2001; pp. 623–634.

"An Integrated Controller for a High Frequency Buck Converter"; Lau et al.; May 1997; pp. 246–254.

"A Low–Voltage CMOS DC–DC Converter for a Portable Battery–Operated System"; Stratakos et al; May 1994; pp. 619–626.

"International Rectifier Introduces HexFET® Power MOS in FlipFET™ Packages Enabling World's Highest Power Density"; http://www.irf.com/whats–new/nr000612a.html; Jun. 2000; 2 pp.

* cited by examiner

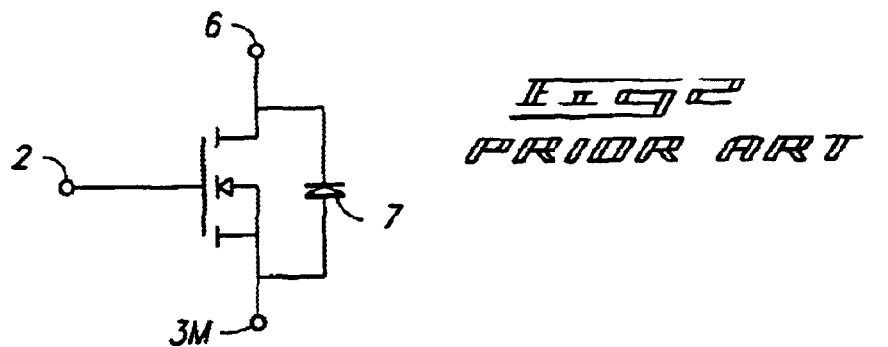
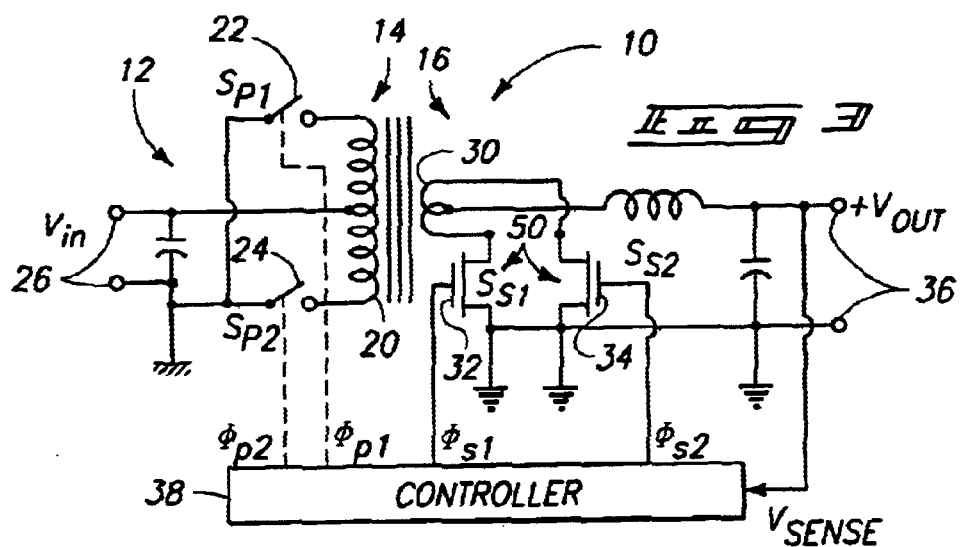
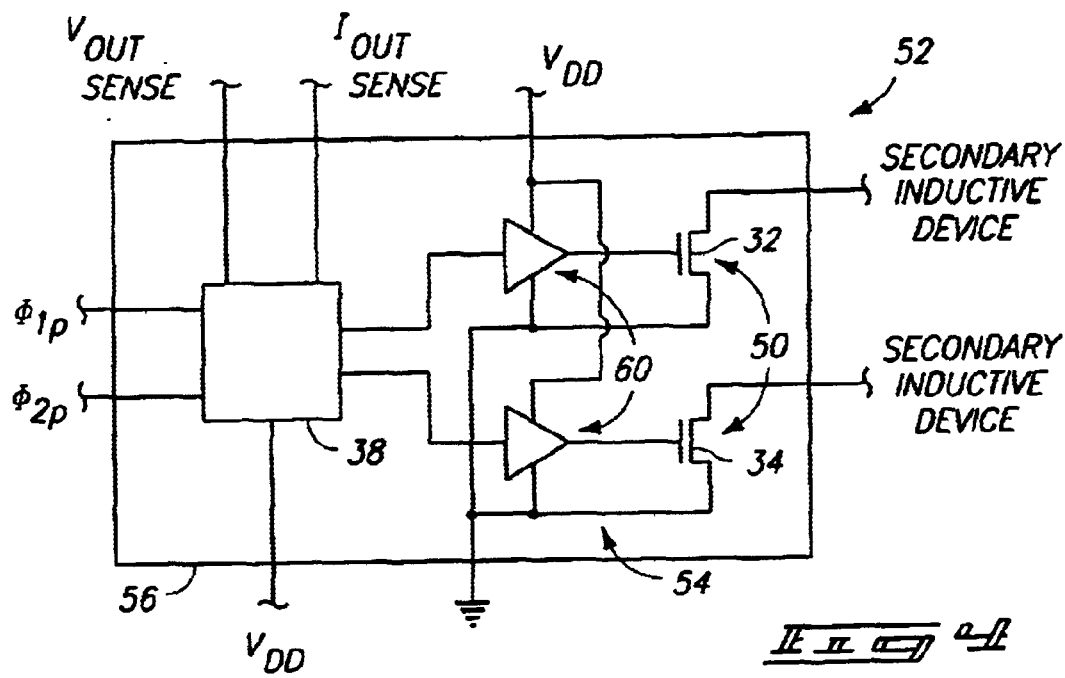

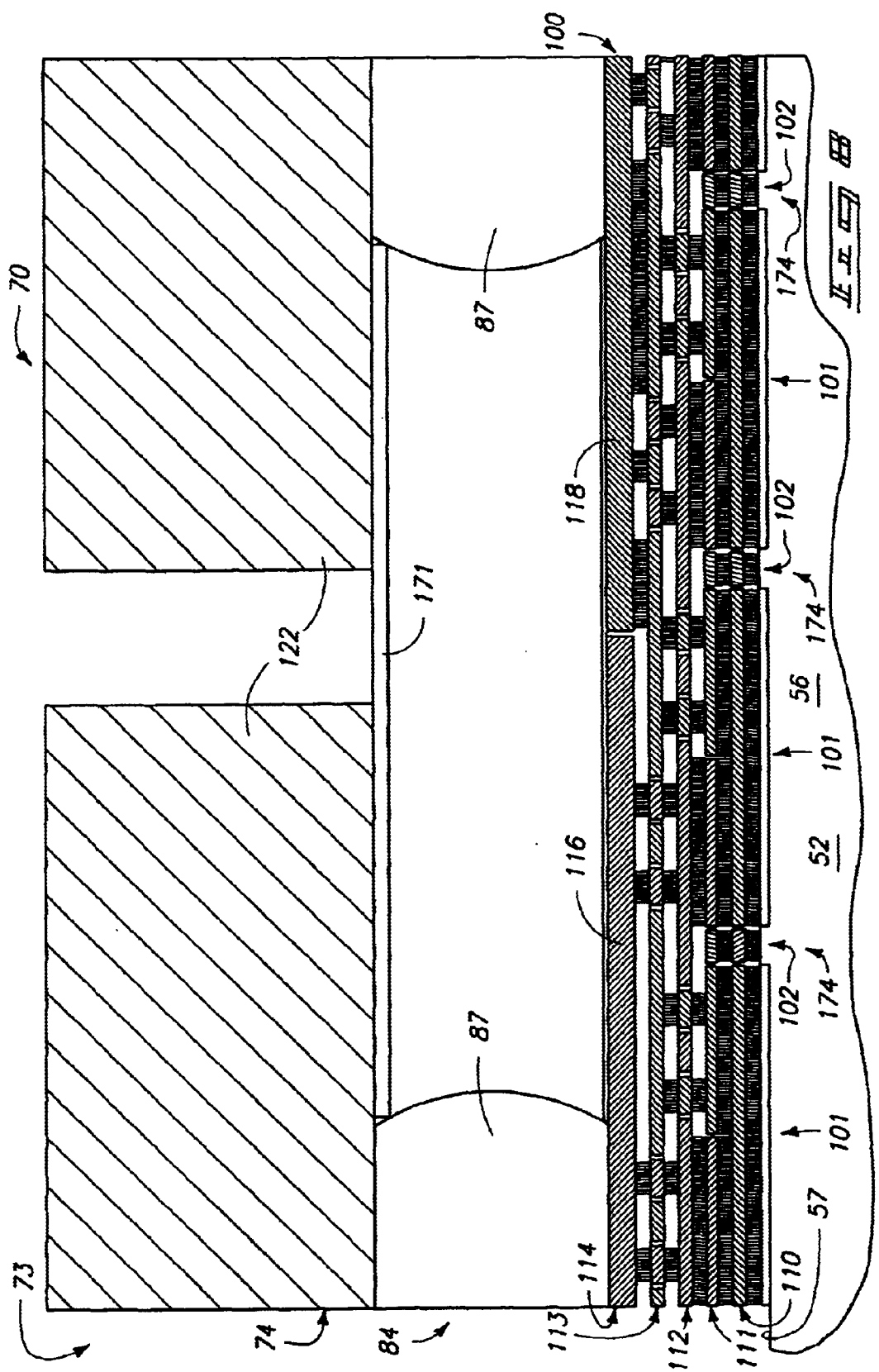

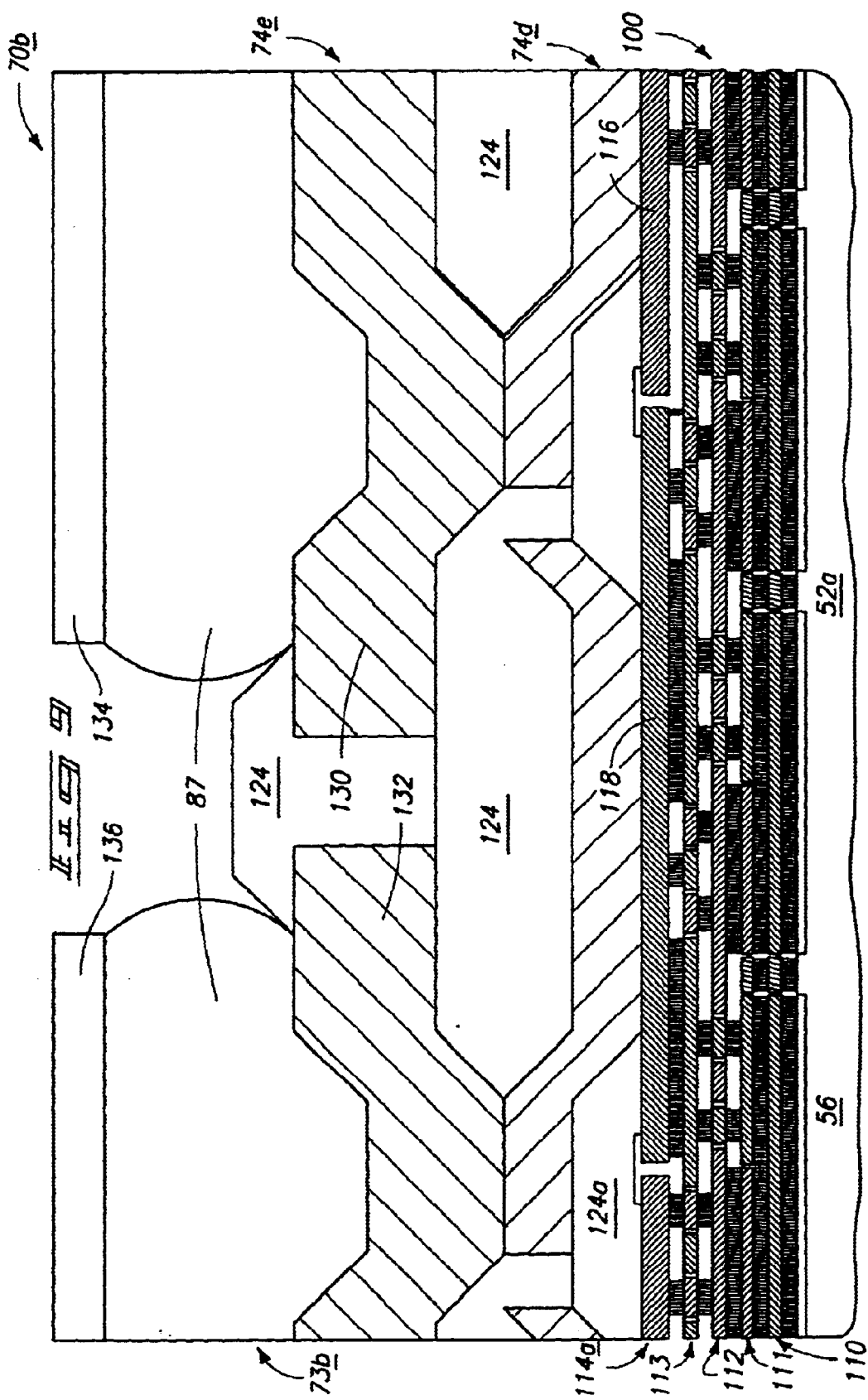

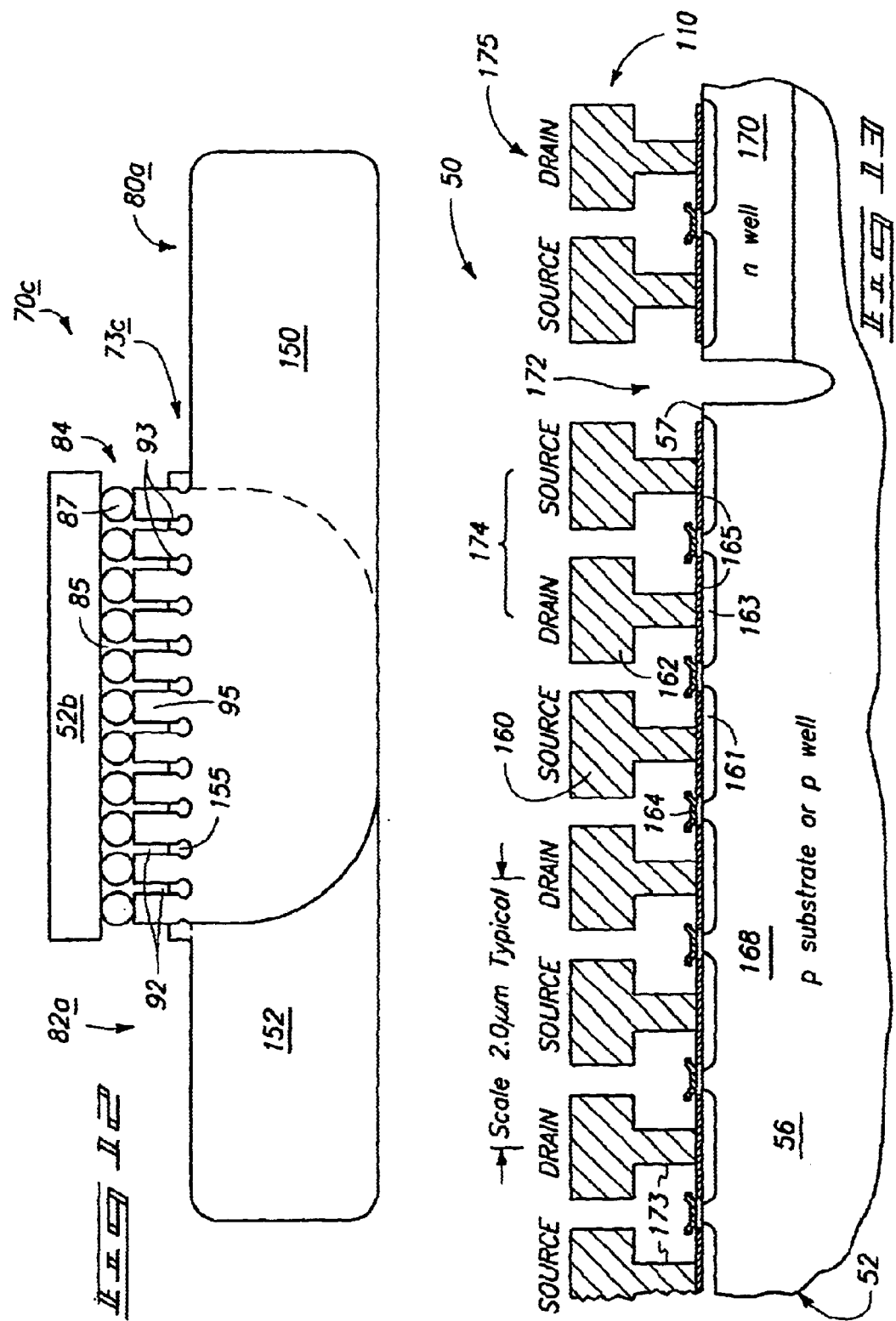

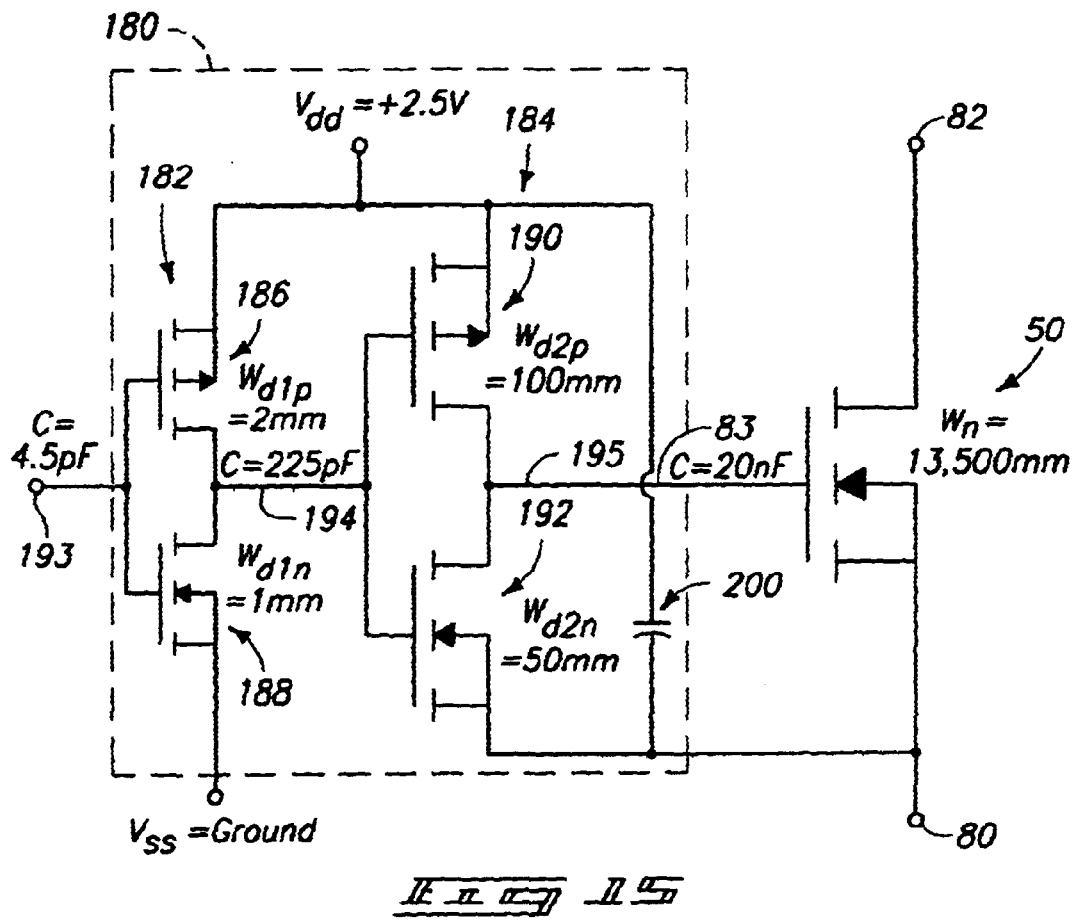
$\mathbb{F}\mathbb{L}\mathbb{G}$ $\mathbb{15}$
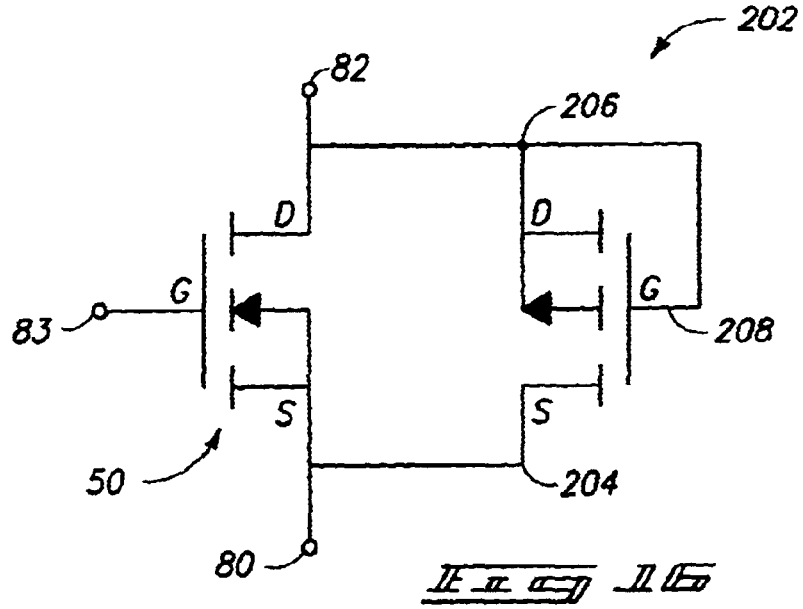
$\mathbb{F}\mathbb{L}\mathbb{G}$ $\mathbb{16}$

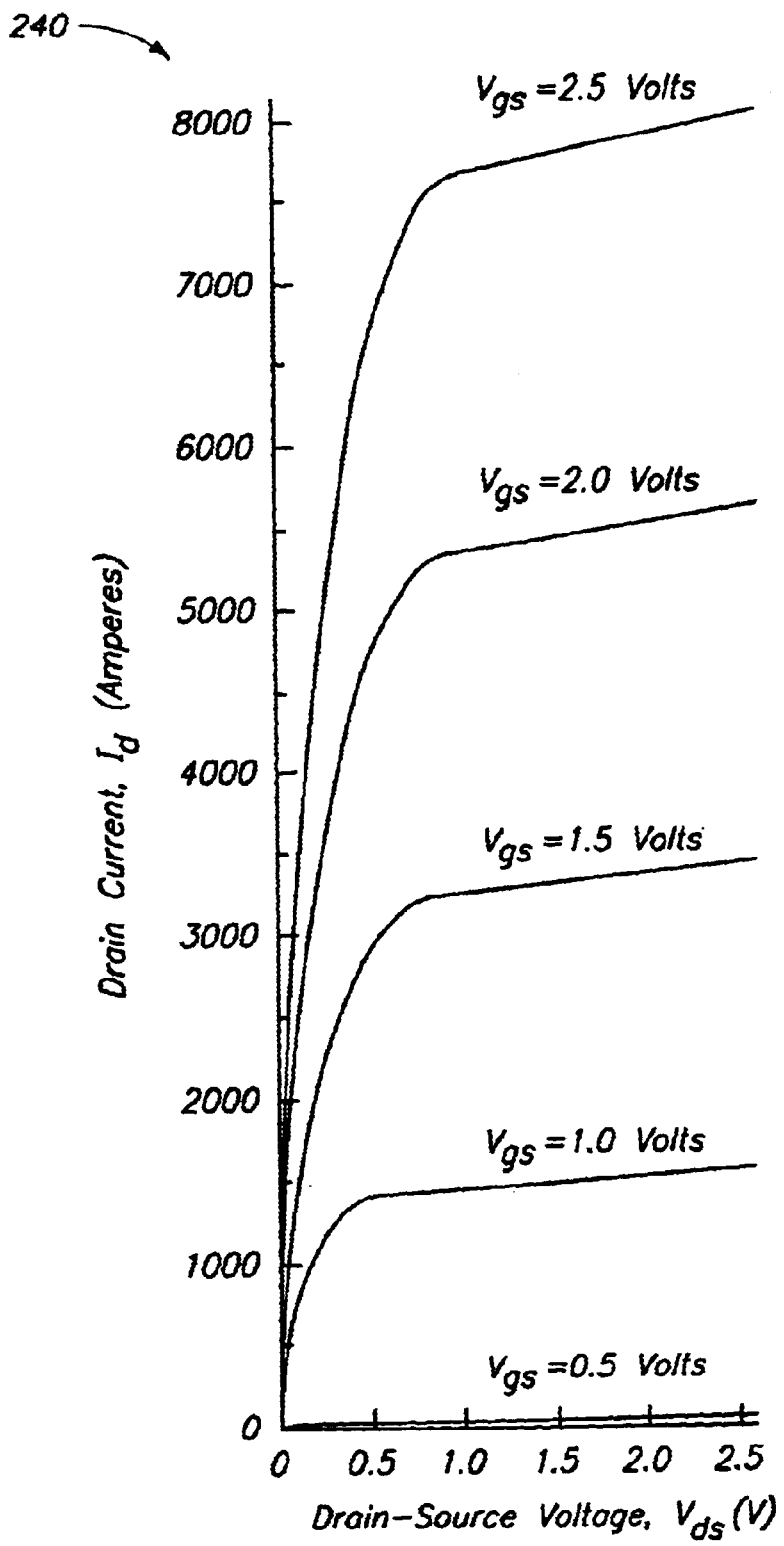

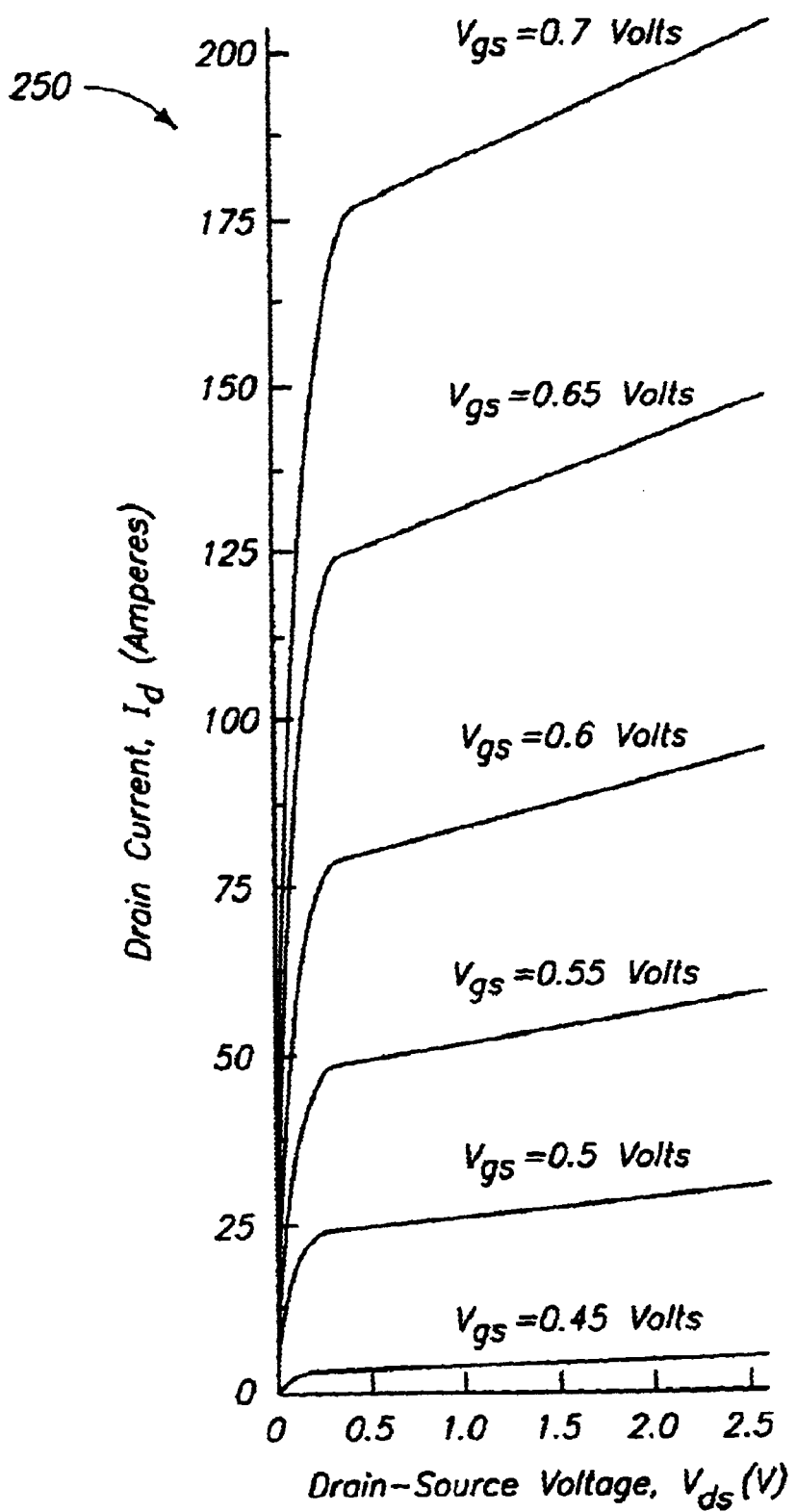

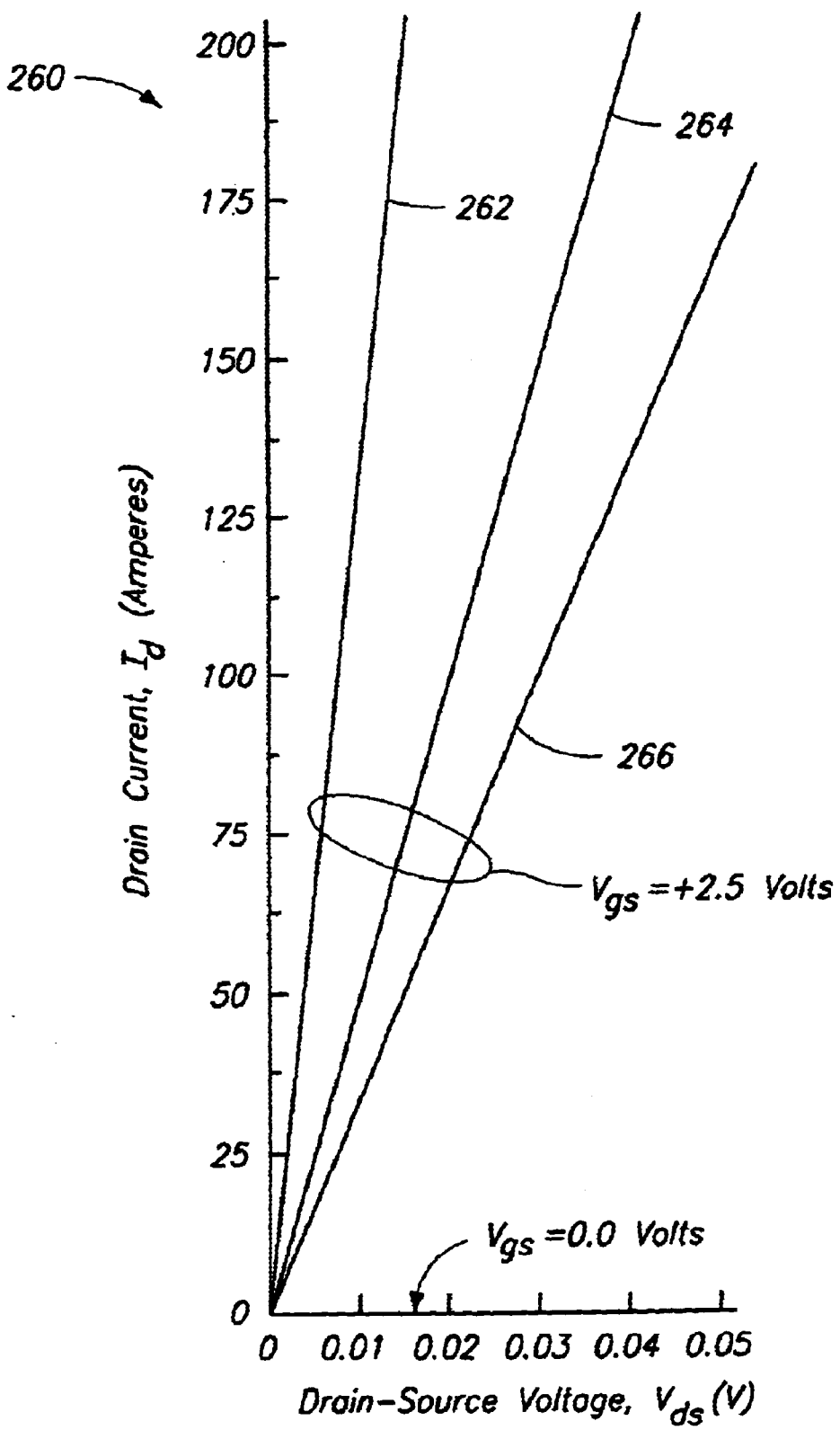

POWER SEMICONDUCTOR SWITCHING DEVICES, POWER CONVERTERS, INTEGRATED CIRCUIT ASSEMBLIES, INTEGRATED CIRCUITRY, POWER CURRENT SWITCHING METHODS, METHODS OF FORMING A POWER SEMICONDUCTOR SWITCHING DEVICE, POWER CONVERSION METHODS, POWER SEMICONDUCTOR SWITCHING DEVICE PACKAGING METHODS, AND METHODS OF FORMING A POWER TRANSISTOR

CROSS REFERENCE TO RELATED APPLICATION

This application claims priority from U.S. Provisional Application Ser. No. 60/217,860, which was filed on Jul. 13, 2000, titled "Low Cost Ultra-Low On-Resistance High-Current Switching MOSFET for Low Voltage Power Conversion", naming Richard C. Eden and Bruce A. Smetana as inventors, and which is incorporated by reference herein.

PATENT RIGHTS STATEMENT

This invention was made with Government support under Contract No. MDA-904-99-C-2644/0000 awarded by the Maryland Procurement Office of the National Security Agency (NSA). The Government has certain rights in this invention.

TECHNICAL FIELD

This invention relates to power semiconductor switching devices, power converters, integrated circuit assemblies, integrated circuitry, current switching methods, methods of forming a power semiconductor switching device, power conversion methods, power semiconductor switching device packaging methods, and methods of forming a power transistor.

BACKGROUND OF THE INVENTION

Computational power of digital processing circuitry is related to the conversion of input DC power to waste heat. As digital computational powers increase, the associated power consumption and heat generated by processing devices also increase. Power supply voltages of logic circuits have been reduced from 5 Volts to 1.2 Volts or less to alleviate excessive generation of heat and power consumption. However, reduction of power supply voltages has complicated other issues of power supply and distribution to logic circuits. For example, electrical resistance between power supplies and logic circuits has a more significant impact upon efficiency as supply voltages continued to be reduced.

Some designs have provided power to PC boards at high voltages (e.g., 48 Volts) and then utilize on-board converters to convert the received high voltage energy to 1.2 Volt or other low voltage supply energy for application to logic circuits. To minimize the size of such converters, the stored energy requirements in the magnetics and capacitors can be reduced by increasing the switching frequency of the converter. However, conventional power semiconductor configurations utilized in converters and capable of handling relatively large currents can not typically switch efficiently at the desired switching speeds.

FIG. 1 depicts a conventional vertical geometry power MOSFET device having a plurality of n+ source contact regions 3 which lie within p (body) regions 3P (typically formed as hexagonal islands), where both the p (body) regions 3P and the n+ source contact regions 3 are electrically connected to the upper source contact metal 3M. The gate conductors 2 are insulated from source contact metal 3M under which they lie by the insulator 3l and from the silicon substrate by the thin gate insulator 2l. The gate conductors 2 cover the regions between the p (body) regions 3P, extending across the edge (surface channel) portion of the perimeter of the p (body) regions 3P to the n+ source regions 3. When the gate conductors 2 are biased more positively than the threshold voltage of this conventional n-channel power MOSFET, electron flow through these surface channel regions is induced which results in electron flow along indicated paths 4. Electron paths 4 are formed from the adjacent n+ source regions 3 horizontally through the surface channel, vertically through the n− drain drift region 5N to the n+ drain region 5 to the bottom drain metallization contact 6 shown in FIG. 1. This current flow path leads to values of source-drain ON resistance that are higher than desired for efficient low voltage power conversion applications.

The equivalent circuit of a conventional power MOSFET illustrated in FIG. 1 is depicted in FIG. 2. A p-n body diode 7 is provided from the source 3 to the drain 6 and comprises the p body region 3P and the n− and n+ drain regions 5N and 5 shown in FIG. 1. The body diode 7 is a relatively large p-n$^-$-n$^{30}$ diode with a very large diffusion charge storage capacity $Q_d$. Accordingly, when the body diode 7 is first reversed biased after heavy forward conduction, a large transient reverse current $j_r$ flows for a substantial period of time $t_r = Q_d/j_r$ which can limit usable switching frequencies.

There exists needs for improved semiconductor devices and methodologies which overcome problems associated with conventional arrangements.

BRIEF DESCRIPTION OF THE DRAWINGS

The patent or application file contains at least one drawing executed in color. Copies of this patent or patent application publication with color drawing(s) will be provided by the Office upon request and payment of necessary fees.

Preferred embodiments of the invention are described below with reference to the following accompanying drawings.

FIG. 2 is a schematic representation of the conventional power MOSFET equivalent circuit.

FIG. 3 is schematic illustration of an exemplary synchronous rectification power converter.

FIG. 4 is an illustrative representation of exemplary components formed upon a monolithic semiconductor die.

FIG. 8 is a detailed cross-sectional view of the package and a planar high-current silicon switch die of FIG. 5 or FIG. 7.

FIG. 9 is a cross-sectional view of another alternative exemplary configuration of an integrated circuit assembly.

FIG. 12 is another side view of the integrated circuit assembly shown in FIG. 11.

FIG. 13 is an illustrative representation depicting a plurality of exemplary planar MOSFET devices of a power semiconductor switching device.

FIG. 15 is a schematic representation of an exemplary gate driver amplifier coupled with the power semiconductor switching device.

FIG. 16 is a schematic representation of an exemplary active diode p-channel MOSFET coupled with the power semiconductor switching device.

FIG. 17 is a graphical representation depicting drain currents versus a plurality of drain-source voltages of an exemplary power semiconductor switching device.

FIG. 18 is another graphical representation depicting drain currents versus additional drain-source voltages of the exemplary power semiconductor switching device graphed in FIG. 17.

FIG. 19 is yet another graphical representation depicting drain currents versus drain-source voltages of the exemplary power semiconductor switching device graphed in FIG. 17 and FIG. 18.

DETAILED DESCRIPTION OF THE PREFERRED EMBODIMENTS

Figure 1:
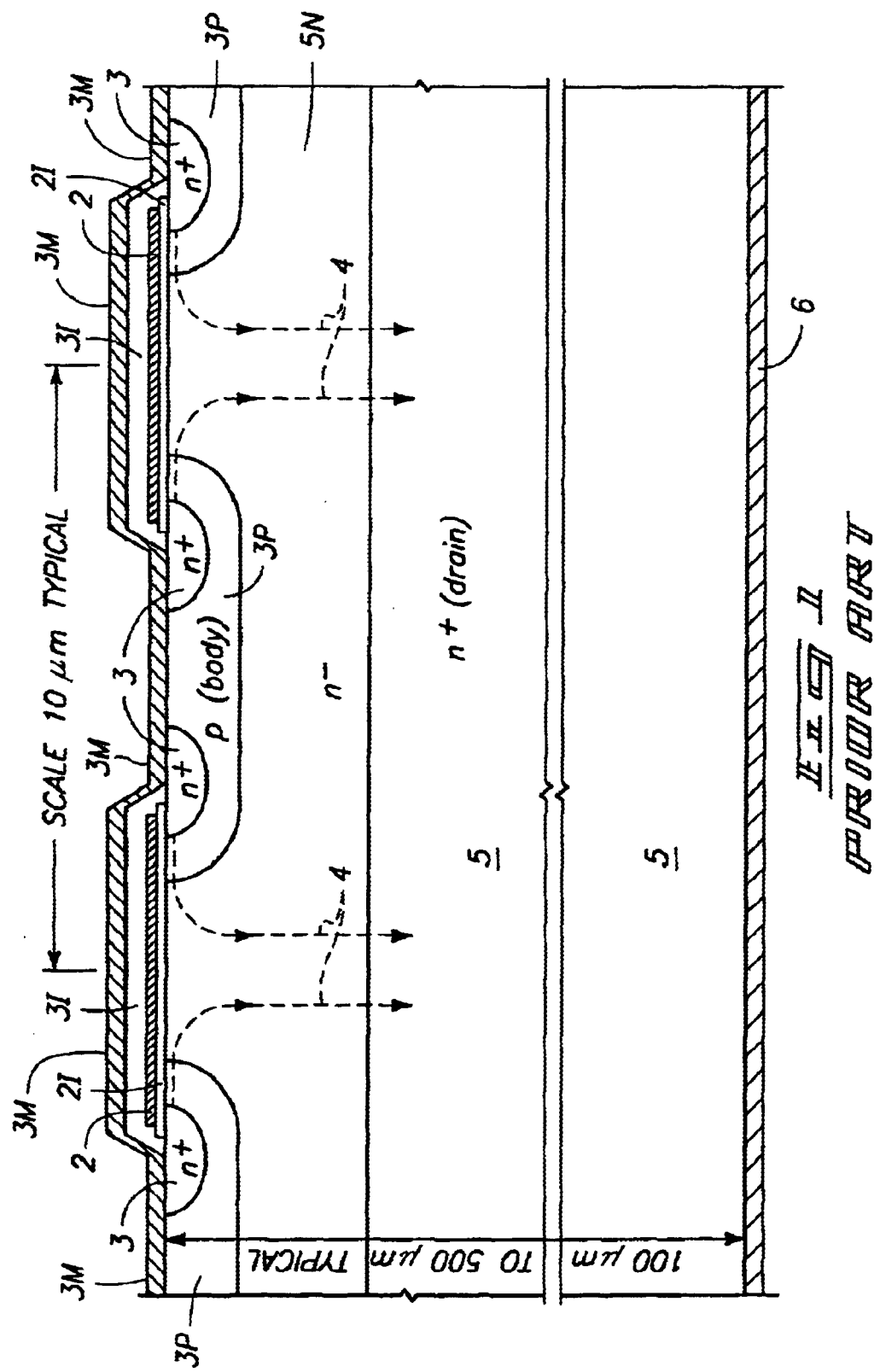
FIG. 1 is a cross-sectional view of a conventional vertical power MOSFET device.

This disclosure of the invention is submitted in furtherance of the constitutional purposes of the U.S. Patent Laws "to promote the progress of science and useful arts" (Article 1, Section 8).

Like reference numerals represent like components with differences therebetween being represented by a convenient suffix, such as "a".

Referring to FIG. 3, a switching power converter 10 is depicted according to exemplary aspects of the present invention. The switching power converter 10 illustrated in FIG. 3 is configured as a synchronous rectification power converter. Other configurations of power converter 10 are possible. The illustrated embodiment of power converter 10 includes a transformer 12 comprising a primary side 14 and a secondary side 16. Power converter 10 is configured to implement DC to DC power conversion operations. High-current, low "on" resistance planar MOSFET power semiconductor switching devices illustrated as reference 50 provided according to aspects of the present invention are included on the secondary side 16 of power converter 10 in the depicted embodiment. In a conventional diode rectified power converter, the switches 50 would be replaced by a pair of Schottky diode rectifiers with their anodes grounded.

Primary side 14 comprises a center-tapped primary transformer winding 20 coupled with plural primary switching devices 22, 24 and primary terminals 26. Switching devices 22, 24 are implemented intermediate one of primary terminals 26 and primary transformer winding 20.

Secondary side 16 includes a center-tapped secondary transformer winding 30 coupled with a plurality of secondary switches 32, 34 and secondary terminals 36. Primary side 14 receives electricity via terminals 26 at a first voltage and a first current in one implementation of power converter 10. Secondary transformer winding 30 is coupled with primary transformer winding 20 and is configured to provide electricity at a second voltage different than the first voltage and a second current different than the first current to terminals 36. For example, in the depicted exemplary embodiment, primary side 14 is configured to receive electricity at a first voltage greater than the voltage provided upon secondary side 16. In addition, primary side 14 receives current having a magnitude less than the magnitude of current provided at terminals 36.

In one exemplary application, power converter 10 is implemented to provide electricity to an associated microprocessor and/or other processing device(s) in a low voltage application (e.g., 1.2 Volts, 2.5 Volts) wherein utilization of diodes, for example in a diode rectification power converter, is rendered inefficient by the excessive voltage drops across the diode rectifier switching devices. For example, power converter 10 may be utilized in a personal computer, server, work station or other processing and logic circuitry applications, including low voltage, high current applications.

As shown, a controller 38 is provided coupled with primary switches 22, 24, secondary switches 32, 34 and secondary terminals 36. Controller 38 is configured to monitor output voltage and current via secondary terminals 36 to control operations of power converter 10. For example, controller 38 controls the timing of switching operations of primary switches 22, 24 and secondary switches 32, 34 to implement appropriate power conversion operations and to maintain the voltage and current of electricity within secondary side 16 in a desired range.

As described in detail below, secondary switches 32, 34 are configured to withstand power currents. Exemplary power currents include currents experienced within power devices which are greater than typical signaling currents which are usually a few tens of milliamps. Exemplary power currents are greater than one Ampere and reach magnitudes of 100 Amperes–200 Amperes or greater in exemplary configurations. Secondary switches 32, 34 are implemented as power semiconductor switching devices 50 described herein according to additional aspects of the invention. Such devices 50 may be configured to accommodate currents approaching or exceeding 1000 Amperes in exemplary configurations.

Power semiconductor switching devices 50 comprise high current devices having ultra low ON resistance values ($R_{on}$) in exemplary configurations. Utilizing power semiconductor switching devices 50 described herein, $R_{on}$ values less than 0.00015 Ohms are possible for configurations capable of handling 200 Amperes. Accordingly, it is favorable to use the low voltage, high current power devices 50 as secondary switches 32, 34 having low $R_{on}$ values for improved efficiency.

In the depicted power converter applications, controller 38 is configured to sense output voltages and currents at terminals 36. Responsive to such monitoring, controller 38 applies control signals to primary switches 22, 24 and secondary switches 32, 34 to control the operation of the switches to maintain the voltages and currents at terminals 36 within a desired range. As illustrated, controller 38 applies control signals to the gates of secondary switches 32, 34 implemented as power semiconductor switching devices 50 according to exemplary aspects of the invention.

Referring to FIG. 4, an exemplary configuration of secondary switches 32, 34 configured as power semiconductor switching devices 50 according to aspects of the present invention is illustrated. Power semiconductor switching devices 50 individually comprise a power MOSFET transistor which may be formed by a plurality of MOSFET transistors coupled in parallel according to additional aspects of the invention. One common control signal is utilized to control the individual MOSFET transistors of the power device 50. Exemplary MOSFET transistors utilized to form an individual one of the power semiconductor switching devices 50 are described below as reference 174 in FIG. 13 and FIG. 14. Such transistors are implemented as planar, horizontally configured n-channel MOSFET devices in one exemplary aspect.

FIG. 4 depicts a monolithic semiconductor die 52 containing plural power semiconductor switching devices 50 according to one embodiment. The semiconductor die 52 is fabricated from a monolithic semiconductive substrate 56 in the described exemplary embodiment. For example, semiconductor die 52 is formed from a semiconductive wafer (not shown) such as silicon, silicon carbide, gallium arsenide or other appropriate semiconductive substrate.

In the described embodiment, portions of semiconductive substrate 56 are doped with a p-type dopant providing a p-substrate or p-well. In addition, an n-well may also be formed within semiconductive substrate 56. As described further below, n-channel MOSFET devices are formed within portions of substrate 56 comprising p-type portions or wells of substrate 56 and p-channel MOSFET devices are formed within n-type portions or wells of substrate 56. P-type and n-type portions of substrate 56 are shown in FIG. 13 for example.

The depicted monolithic semiconductor die 52 also comprises auxiliary circuitry 54 according to aspects of the present invention. Auxiliary circuitry 54 is circuitry apart from circuitry comprising power semiconductor switching devices 50. In some applications, auxiliary circuitry 54 is coupled with and favorably utilized in conjunction with power devices 50. For example, auxiliary circuitry 54 comprises controller circuitry or driver circuitry to control power semiconductor switching devices 50. In other applications, auxiliary circuitry 54 is not coupled with and is unrelated to operations of power semiconductor switching devices 50. In some configurations, auxiliary circuitry 54 is implemented as application specific integrated circuitry (ASIC).

The depicted semiconductor die 52 is illustrated with respect to the power converter 10 application of FIG. 3. Other configurations of semiconductor die 52 including other arrangements of power semiconductor switching devices 50 and auxiliary circuitry 54 configured for other applications are possible. In the illustrated exemplary configuration, auxiliary circuitry 54 formed upon monolithic semiconductor die 52 and comprising controller 38 and gate amplifiers 60 are configured to couple with at least one of the electrical contacts (i.e., gate contact in the arrangement of FIG. 4) of the respective power semiconductor switching devices 50.

Regardless of the application of die 52 or power devices 50, aspects of the present invention provide auxiliary circuitry 54 upon monolithic semiconductor die 52 including power semiconductor switching devices 50. Fabrication of power semiconductor switching devices 50 using common CMOS processing methodologies according to aspects of the present invention or other processing techniques facilitates formation of auxiliary circuitry 54 using similar processing methodologies upon monolithic semiconductor die 52. For example, if CMOS processes are used to form devices 50, such CMOS processes can also be utilized to form auxiliary circuitry 54, if desired. Power semiconductor switching devices 50 may be fabricated simultaneously with auxiliary circuitry 54 in such arrangements. The capability to provide auxiliary circuitry 54 upon the semiconductor die 52 is enabled by the fabrication of power semiconductor switching devices 50 comprising planar MOSFET devices according to aspects of the present invention which may be fabricated within a standard CMOS foundry ordinarily used to fabricate small-signal digital or analog circuits.

Apart from the illustrated fabrication efficiencies of power semiconductor switching devices 50 and auxiliary circuitry 54, there may be other reasons to provide auxiliary circuitry 54 upon the same semiconductor die 52 as devices 50. For example, and as described further below, exemplary configurations of power semiconductor switching devices 50 individually comprise a plurality of MOSFETs, including for example, thousands of parallel-coupled MOSFETs (a plurality of MOSFET switching devices of individual power devices 50 are depicted in exemplary configurations in FIG. 13 and FIG. 14). Provision of auxiliary circuitry 54 including control circuitry and driver circuitry upon the same die 52 as devices 50 advantageously facilitates driving the gate capacitances of the individual MOSFETs comprising power devices 50 and minimizes the capacitance which must be driven by external control circuitry such as the outputs from the converter controller 38. Further details regarding driving gate capacitances of devices 50 are described below and other advantages may be gained by providing auxiliary circuitry 54 upon monolithic substrate 56.

In particular, it may be desired to provide converter controller 38 adjacent to the secondary side 16 in synchronous rectifier switching applications. According to embodiments described herein, auxiliary circuitry 54 is configured as converter controller 38 provided upon die 52 including power devices 50. Providing controller 38 adjacent to devices 50 is advantageous to significantly reduce parts count in providing power converter products. Controller circuitry 38 may be implemented using analog or digital control circuit configurations.

As mentioned above, power converter controller 38 provides respective control signals to control the operation of secondary switches 32, 34 implemented as power semiconductor switching devices 50 upon die 52 according to aspects of the present invention. Controller 38 is also configured to apply control signals externally of semiconductor die 52. For example, controller 38 is arranged in the exemplary configuration to apply control signals ($Phi_{p1}$, $Phi_{p2}$) to primary switches 22, 24 to control switches 22, 24, generally through some type of isolation device to enable isolation between the input side 14 and output side 16 grounds of power converter 10. Power controller 38 is also coupled with output terminals 36 to sense voltages and currents within the secondary side 16 of power converter 10. Bond pads (not shown) are provided upon semiconductor die 52 to provide coupling of die 52 with external circuitry including terminals 36 and isolation devices coupling to primary switches 22, 24.

As discussed above, auxiliary circuitry 54 further includes gate driver amplifier circuits 60 coupled intermediate controller 38 and respective power semiconductor switching devices 50. Gate driver amplifier circuits 60 operate to improve power conversion operations or other operations requiring controlled switching of power semiconductor devices 50. Further details regarding an exemplary configuration of amplifiers 60 are discussed below in FIG. 15 as reference 180.

As mentioned above and according to aspects of the invention, power semiconductor switching devices 50 may be individually implemented as a plurality of parallel-coupled MOSFETs including parallel-coupled gates, parallel-coupled sources and parallel-coupled drains. Gate driver amplifier circuits 60 are configured to provide respective control signals to the parallel-coupled gates of the MOSFETs of power semiconductor switching devices 50. Depending upon the application of power devices 50 (e.g., application within power converter 10) significant input currents may be required to drive the MOSFET gates of individual power semiconductor switching devices 50. Utilization of gate driver amplifiers 60 according to aspects of the invention facilitates driving these input currents and minimizes the capacitance which must be driven by the control circuitry controlling the gates of power semiconductor switching devices 50 providing improved switching speeds.

Further, large current spikes involved in charging and discharging gate capacitance of power semiconductor switching devices 50 comprising numerous parallel-coupled MOSFETs places demands on available current and provides a serious limitation to timing precision and practical switching speeds. In some configurations, (e.g., some configurations of power semiconductor switching devices 50 comprise 500,000 MOSFET devices or more arranged in parallel as described below) 20 nF gate capacitances are driven. The utilization of gate driver amplifiers 60 upon semiconductor die 52 reduces the capacitance at the gate control input to the gate drive amplifiers 60 to 4.5 pF of a 500,000 MOSFET device 50 which may be easily controlled directly from digital timing circuits such as controller 38 to precisions of a few nanoseconds.

Alternative auxiliary circuitry 54 includes zero-current switching/timing circuitry to detect the absence of currents within secondary inductive device 30. Zero-current switching/timing circuitry may be utilized to determine proper moments in time for controlling switching of secondary switches 32, 34.

According to additional aspects, auxiliary circuitry 54 includes load protection circuitry configured to detect voltage overage conditions and current overage conditions. Controller 38 coupled with appropriate load protection circuitry controls operation of power semiconductor switching devices 50 responsive thereto, including opening or closing appropriate switching devices 22, 24, 32, 34.

According to additional aspects, auxiliary circuitry 54 includes protection circuitry configured to detect drain-source or gate-source voltage overage conditions within devices 50 which could potentially be damaging to the devices and to institute corrective action such as to mitigate the over voltage conditions. Implementation of this function requires coupling from the drains of the power semiconductor switching devices 50 through some type of internal or external voltage discrimination elements (such as a Zener diodes or transient voltage suppression (TVS) circuitry) back to either auxiliary inputs on the respective gate drive amplifiers 60 or to the controller 38 (FIG. 3). When the voltage discrimination element provides feedback that a dangerous overvoltage condition exists at the drain of one of power MOSFET devices 32 or 34, the protection circuitry functions to generate a gate voltage on that device such as to cause a momentary drain current pulse capable of suppressing the overvoltage condition in the manner of an active snubber circuit.

Exemplary configurations of zero-current switching/timing circuitry, load protection circuitry, active snubber circuitry or other configurations of auxiliary-circuitry 54 are implemented as application specific integrated circuitry (ASIC) as mentioned above.

The depicted exemplary configuration of device 50 within semiconductor die 52 is provided for discussion purposes with respect to the exemplary power converter 10 application. Other configurations are possible including provision of a single power semiconductor switching device 50, additional power semiconductor switching devices 50 and/or other associated auxiliary circuitry 54 upon an appropriate semiconductor die 52. Other power conversion configurations and other applications of power semiconductor switching devices 50 described herein are possible. Power semiconductor switching devices 50 are usable in other low voltage, high current applications apart from exemplary applications described herein.

Figure 14:
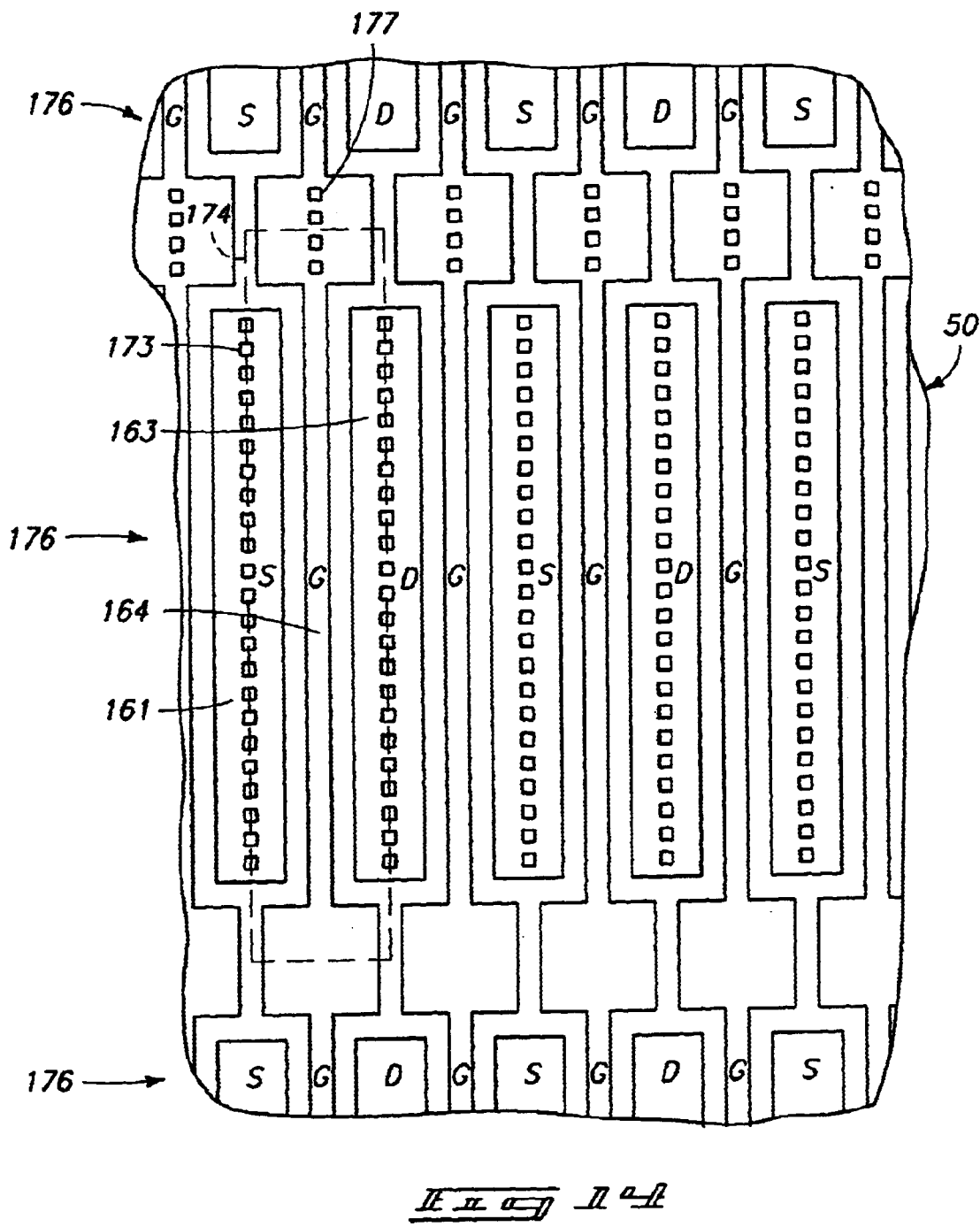
FIG. 14 is a plan view of an exemplary arrangement of the planar MOSFET transistors of FIG. 13 fabricated within a semiconductor die.

Aspects of the present invention also provide devices and methods for packaging of power semiconductor switching devices 50 and semiconductor die 52 including devices 50. As set forth above, devices 50 according to exemplary configurations comprise plural MOSFET devices coupled in parallel. Examples of such MOSFETs are depicted in FIG. 13 and FIG. 14 as planar, horizontally configured MOSFETs having high-current power electrodes (e.g., source and drain) provided adjacent on a common surface as opposed to conventional power MOSFETs wherein the source is provided upon an upper surface and the drain is provided upon an opposing lower surface, as illustrated in FIG. 1.

Various exemplary packaging configurations and integrated circuit assemblies according to aspects of the present invention are described hereafter with reference to FIG. 5–FIG. 12. The illustrated configurations are exemplary and other packaging or assembly arrangements are possible for power semiconductor switching devices 50, including other combinations of the various layers and electrical connections depicted in FIG. 5–FIG. 12.

Figure 5:
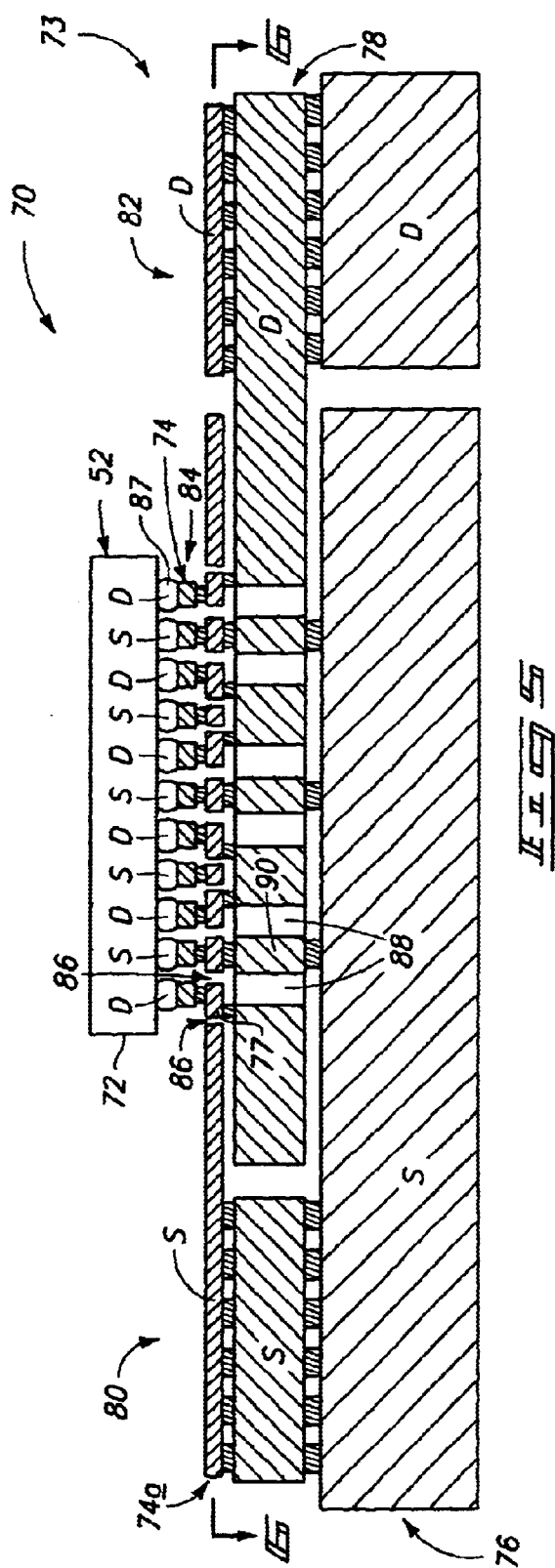
FIG. 5 is a side cross-sectional view of an exemplary high-current, low resistance area interconnect die package assembly.
Figure 6:
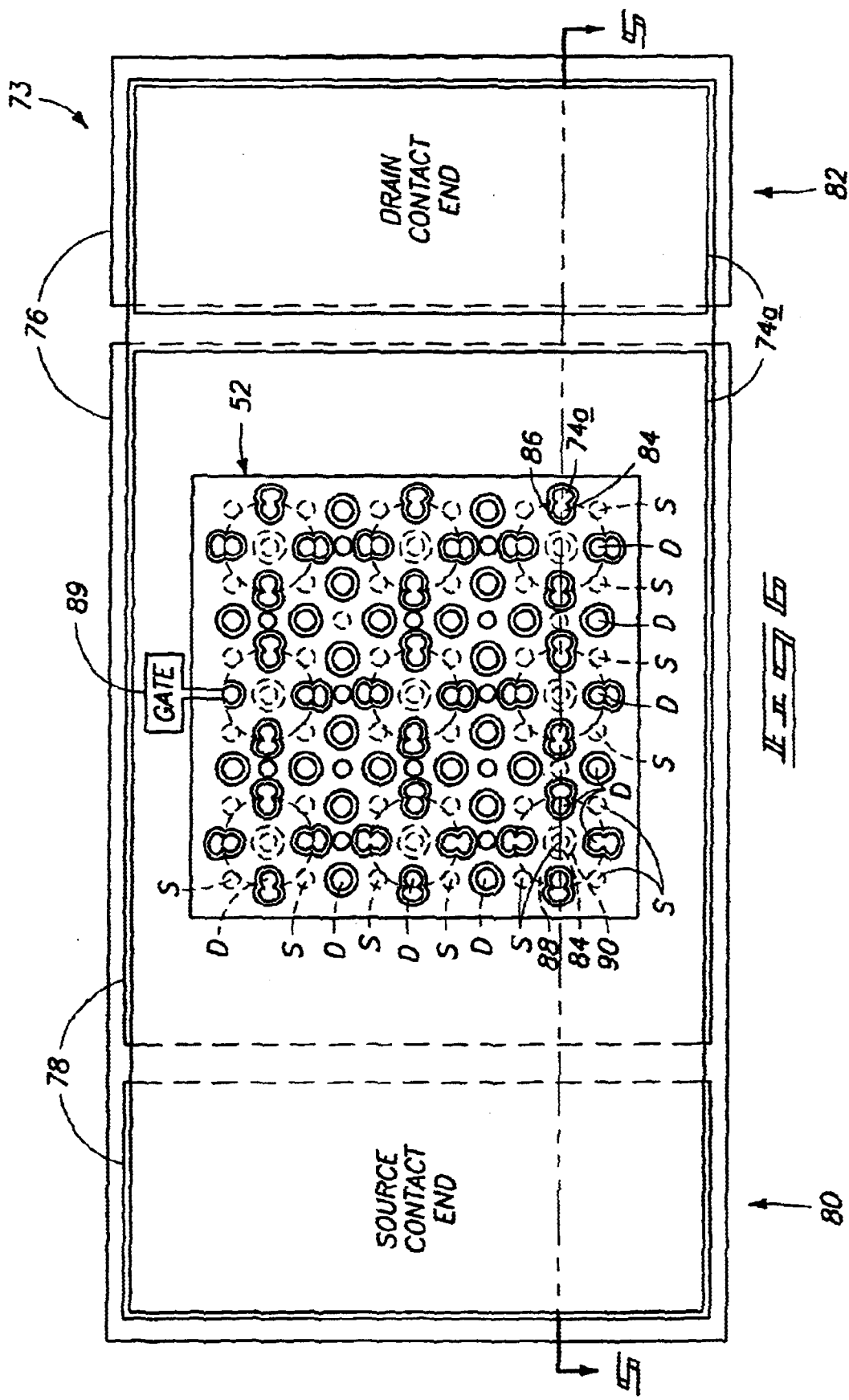
FIG. 6 is another (top) cross-sectional view of the high-current, low resistance area interconnect die package assembly of FIG. 5.

Referring to FIG. 5 and FIG. 6, a first exemplary integrated circuit assembly 70 is shown. Integrated circuit assembly 70 includes semiconductor die 52 including one or more power semiconductor switching device 50 and auxiliary circuitry 54 (if circuitry 54 is provided within die 52). In the illustrated example, semiconductor die 52 is implemented in a flip chip configuration. Other packaging designs of semiconductor die 52 are possible.

Integrated circuit assembly 70 further includes a package 73 coupled with semiconductor die 52. Package 73 comprises one or more intermediate layer 74, a source plane 76, and a drain plane 78 (plural layers 74, 74a are illustrated in the exemplary package configuration of FIG. 5 and one intermediate layer is shown in the exemplary arrangement of FIG. 3 in Appendix A).

Intermediate layer(s) 74 comprise "fineline" layer(s) in the illustrated exemplary embodiment. For example, intermediate layer(s) 74 are implemented as plated copper planes (5–10 microns typical). Intermediate layer(s) 74 are capable of being patterned to horizontal feature sizes sufficiently small as to allow area array contact to the semiconductor die 52. Intermediate layer(s) 74 which provide electrical conduction in a horizontal direction may be referred to as horizontal interconnect layers.

In one exemplary embodiment, drain plane 78 is implemented as a plated copper plane (0.010 inches or 250 microns typical) and plane 76 is implemented as a source plane comprising copper-invar-copper (0.030 inches or 750 microns typical). Other configurations of layer(s) 74 and planes 76, 78 are possible.

For example, the drain plane 78 may be divided into two or more portions in an exemplary alternative configuration wherein individual portions service respective portions (e.g., halves) of the area of die 52 and coupled with two separate drain contact areas. In such an arrangement, a die containing two power devices 50 as illustrated in FIG. 4 could be accommodated (whereas the illustration of FIG. 5 and FIG. 6 shows only a single high-current drain contact 82, along with the single high-current source contact 80, suitable for a die 52 having a single power device 50 in the depicted exemplary configuration).

In addition, the integrated circuit assembly 70 includes a single terminal source contact 80 and a single terminal drain contact 82 in the depicted exemplary configuration. Opposing ends of planes 76, 78 define terminal contacts 80, 82 in the exemplary configuration. Terminal contacts 80, 82 are configured to couple with devices external of assembly 70 upon installation of assembly 70 into final products (e.g., terminal contacts 80, 82 couple with a motherboard in an exemplary computer application).

Referring to FIG. 6, one or more gate lead replaces a drain solder ball in the array to provide connectivity to the gate of device 50. The package lead which attaches to the gate may be fabricated in layer 74 if the gate ball is at the perimeter. FIG. 6 depicts further details of the package 73 of FIG. 5 looking downward through a cross-sectional line passing through intermediate layer 74a. Die 52 and gate contact 89 fabricated using layer 74 are shown in FIG. 6 for illustrative purposes.

A plurality of electrical interconnects 84 are depicted which couple intermediate semiconductor die 52 and intermediate layer 74 of package 73. Exemplary electrical interconnects 84 include respective gate, source and drain solder balls 87 coupled with respective mating pads fabricated in intermediate layer 74 in one exemplary configuration. Intermediate layer 74 also provides contact to the gate (as mentioned above) and other lower current connections to the semiconductor die 52 as well as providing external package connection pads for coupling these to a circuit board through suitable connections and can form, in conjunction with solder balls 87 and intermediate layer 74a if desired, the electrical connection between lower current connections of die 52 and their respective external package pads. Electrical interconnects 84 coupled with respective source, drain, gate and other bond pads of semiconductor die 52 (not shown) provide connectivity of such bond pads to intermediate layer 74.

As shown in the depicted embodiment, intermediate layer 74a is spaced from semiconductor die 52 including power semiconductor switching devices 50 therein. Intermediate layer 74a provides proper coupling of source bond pads of semiconductor die 52 with source plane 76 and permits coupling of drain bond pads of semiconductor die 52 with drain plane 78.

Intermediate layer 74a is generally implemented as a source plane in the described embodiment. Layer 74a is coupled with source plane 76 and source terminal contact 80 using a plurality of via conductors 90 within vias 88 passing through, but insulated from, drain plane 78. Via conductors 90 provide connectivity of source plane 76 with the proper associated source electrical interconnects 84 and source portions of intermediate layer 74a.

As shown, layer 74a includes a plurality of vias 86. Portions 77 of layer 74a within vias 86 and electrically insulated from the remainder of layer 74a provide connectivity of respective drain bond pads of die 52 to drain plane 78. Portions of layer 74a within vias 86 provide lateral, horizontal matching of drain bond pads and respective drain interconnects 84 to drain plane 78 as shown illustrating layer 74a as a horizontal interconnect layer.

Electrical interconnects 84 couple source bond and drain pads of semiconductor die 52 with respective portions of layer 74 in the depicted embodiment. Although not illustrated, an appropriate insulative dielectric material may be provided within vias 86, 88, intermediate source plane 76 and drain plane 78, and intermediate source and drain portions of layer 74a. Further, dielectric material may provided at other desired locations to provide appropriate electrical insulation, such as between planes 76 and 78, between plane 78 and layer 74a, and between layers 74 and 74a. Insulative underfill material may also be provided beneath semiconductor die 52 to protect solder balls 87 and semiconductor die 52.

As illustrated, FIG. 5 and FIG. 6 depict an exemplary integrated circuitry assembly 70 comprising an area array bumped flip-chip configuration of die 52 mounted to a fineline augmented package 73. The high density solder bump array may be provided directly upon die pads of semiconductor die 52 and contact a mating high density pad array patterned in layer 74 over layer 74a of package 73.

Package metallization layers thick enough to handle some high source and drain currents can not be patterned fine enough to directly mate to some chip solder bump pitches. Accordingly, in some embodiments, one or more intermediate layer (comprising fineline additive copper/polymer interconnect layers in one embodiment as mentioned above) is implemented to provide an exemplary solution to feature size mismatch of semiconductor die 52 and package 73.

The intermediate layers are implemented to include pattern plated copper conductor layers with patterned benzocyclobutene (BCB) sold under the trademark CYCLOTENE available from the Dow Chemical Company, and comprising appropriate dielectric layers in one exemplary embodiment. Other patternable dielectric materials such as polyimide could also be used as an alternative to BCB. The described exemplary intermediate layer 74 is capable of being patterned with requisite area bump array feature sizes which are thicker than on-chip metal layers (e.g., typically 5–20 microns of copper compared to 0.4–0.8 microns of aluminum upon a CMOS die). However, such are not as thick as 10 mils (254 microns) or more of copper upon main packaging layers implemented as planes 76, 78 in the described embodiment where undivided source and drain currents pass from the package contacts. Further details regarding similar or alternative configurations of package 73 are illustrated below and in FIG. 6A and FIG. 6B of the Appendix and described in the associated text thereof.

Figure 7:
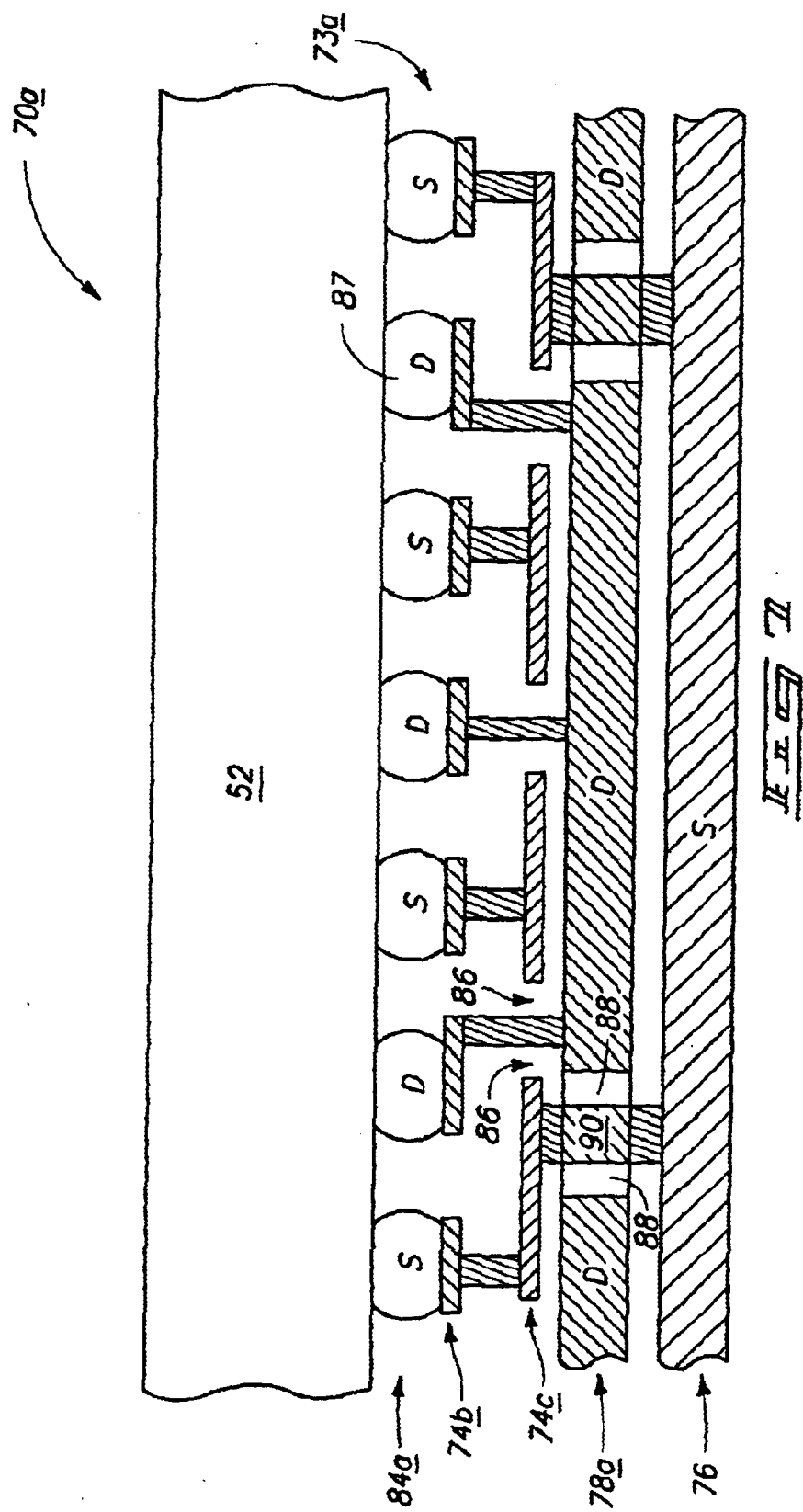
FIG. 7 is a cross-sectional view of an alternative high-current, low resistance area interconnect die package assembly.

Referring to FIG. 7, an alternative configuration of integrated circuit assembly is illustrated as reference 70a. Integrated circuit assembly 70a may be utilized in applications having finer solder ball pitch compared to assembly 70. Integrated circuit assembly 70a includes package 73a including a plurality of intermediate layers depicted as references 74b, 74c. Plural intermediate layers 74b, 74c comprising fineline layers for example and configured as horizontal interconnect layers as shown provide additional flexibility in accommodating feature size mismatch of semiconductor die 52 and package 73a. Additional horizontal interconnect layers for example implemented as additional intermediate layers are utilized in other embodiments if desired to couple additional source and drain bond pads of the semiconductor die 52 with an associated package.

Alternatively, in other configurations, the packages are provided with no horizontal interconnect layers and source and drain pads of semiconductor die 52 are coupled with respective source and drain planes 76, 78 using appropriate via conductors 90 or other appropriate configurations.

Layers 74b, 74c configured as horizontal interconnect layers provide proper connectivity of source and drain electrical interconnects 84a implemented as solder balls 87 with the respective appropriate planes 76, 78a. Layer 74b provides lateral, horizontal alignment for drain connections while layer 74c provides lateral, horizontal alignment for source connections.

Via conductors 90 provide electrical coupling of appropriate portions of layer 74c with source plane 76. The number of via conductors 90 and vias 88 may be varied according to magnitude of currents to be conducted. Although not shown in FIG. 7, appropriate insulative material is provided in assembly 70a to effectively insulate source and drain conductors of die 52 and package 73a.

Figure 10:
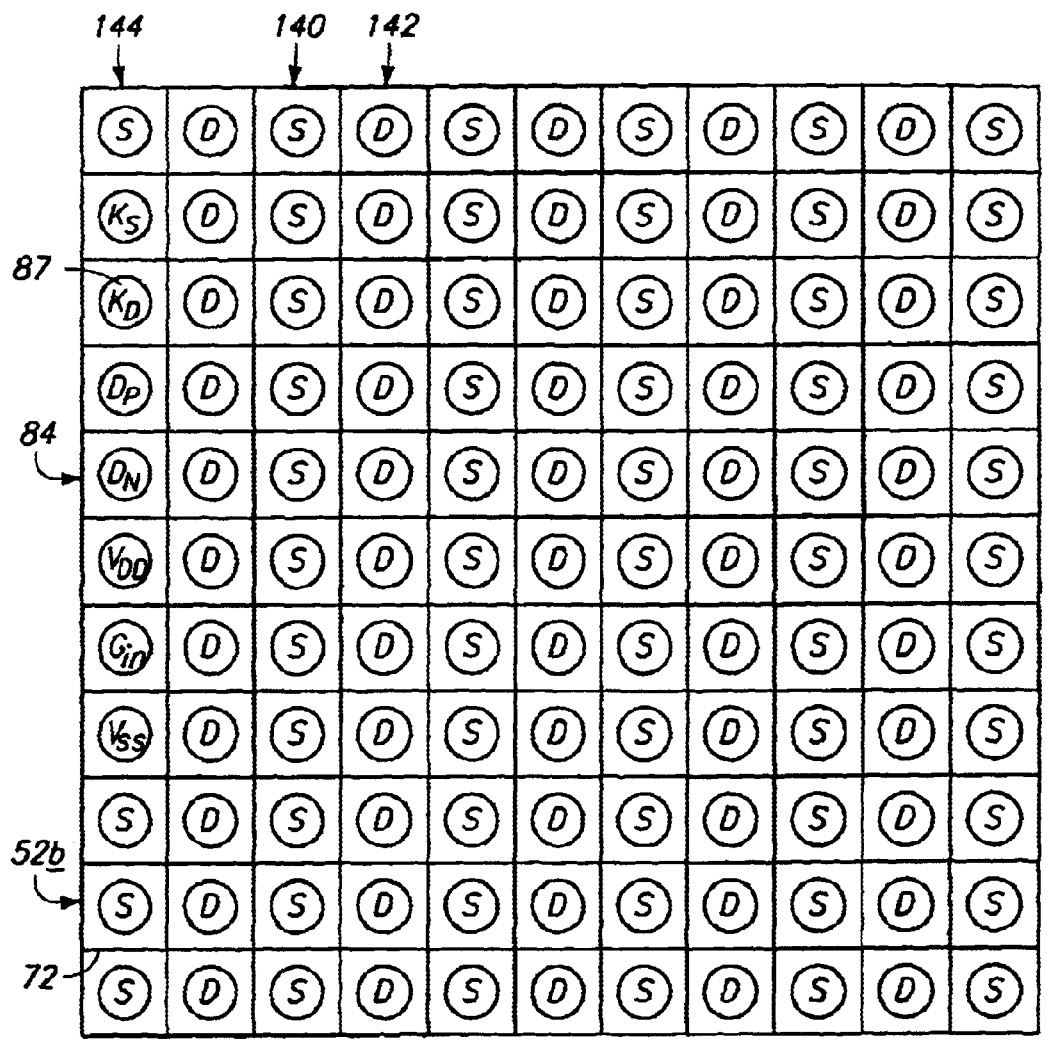
FIG. 10 is a plan view of an exemplary semiconductor die provided in a flip-chip arrangement.

The integrated circuit assemblies depicted herein minimize resistance intermediate source and drain terminal contacts 80, 82. In the exemplary configuration of FIGS. 5 and 6, for example, a total (source+drain) package resistance of approximately 0.0001 Ohms is observed between source and drain terminals 80, 82 in a configuration having a 4 mm×4 mm square semiconductor die 52 having a total of 256 solder balls on a 250 micron pitch (in accordance with the geometry shown in FIGS. 6A and 6B of Appendix A) of a device 50 implemented as a planar MOSFET and comprised of 500,000 MOSFET devices coupled in parallel capable of conducting currents of approximately 200 Amperes. If a finer solder bump pitch, such as 1600 solder balls on a 100 micron pitch were used with the same sized semiconductor die 52 using a finer package contact array pitch as illustrated in FIG. 7 but with the same thicknesses of intermediate layer(s) 74 and planes 76, 78 cited in conjunction with FIGS. 5 and 6, the calculated total (source +drain) package resistance is approximately 0.00008 Ohms. (As shown in FIG. 10 of Appendix A, the modest 23% calculated reduction in package resistance from 103 microOhms to 80 microOhms by going from 256 to 1600 solder balls is accompanied by a calculated reduction in on-chip metallization [the resistance of the metallization layers on the semiconductor die 52] resistance by a factor of 3.7 from 111 microOhms to 30 microOhms).

Figure 8A:
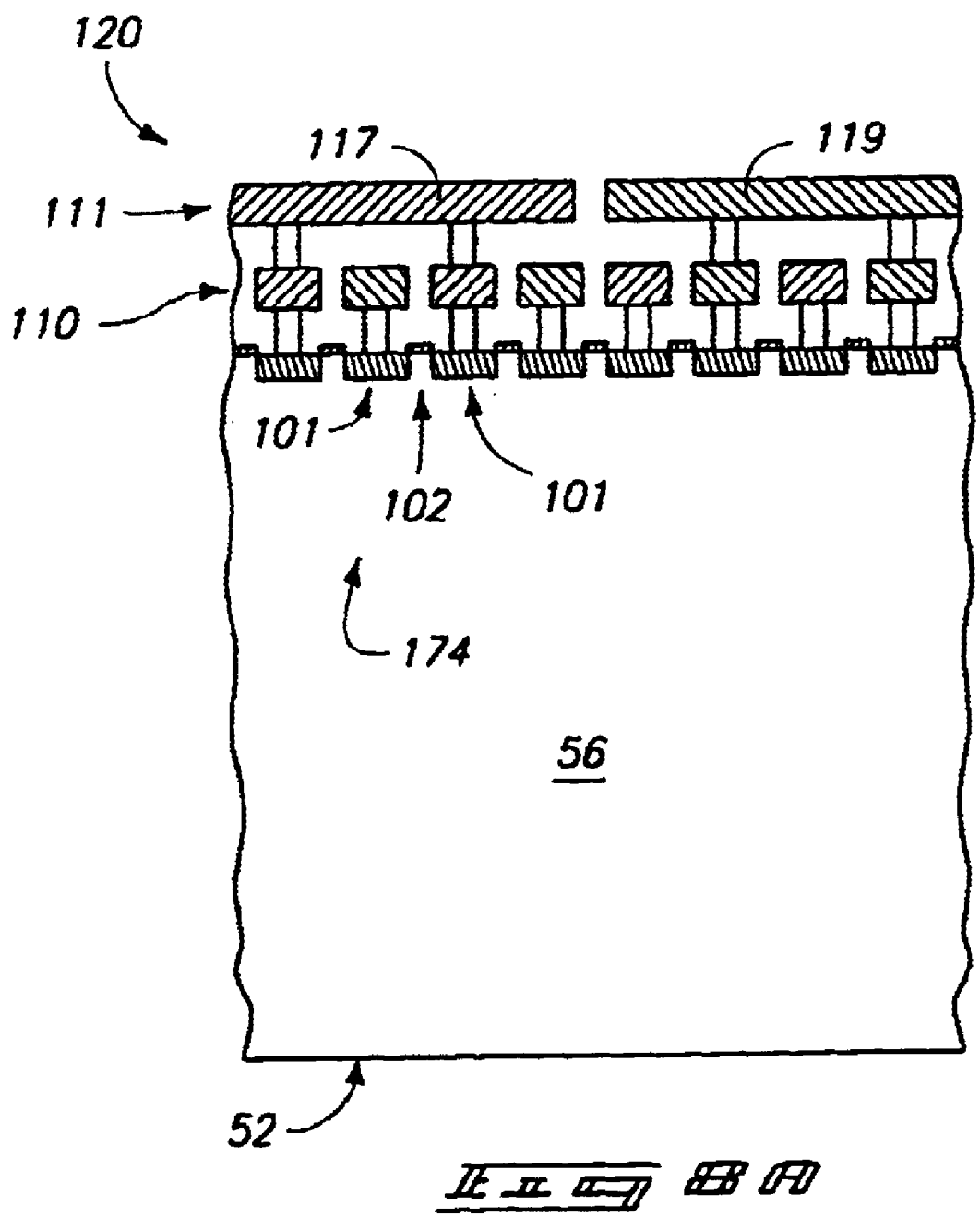
FIG. 8A is another cross-sectional view of a portion of the integrated circuit assembly of FIG. 8.

FIG. 8 and FIG. 9 depict cross-sectional views of exemplary assemblies for power semiconductor switching devices 50 capable of conducting currents in excess of 200 Amperes and comprising approximately 500,000 planar switching MOSFET devices 174 coupled in parallel (only three n-channel devices 174 are shown in each of FIG. 8 and FIG. 9, while FIG. 8A shows an end view of 8 of these n-channel devices). The assembly 70 of FIG. 8 generally corresponds to the assembly depicted in FIG. 5 and FIG. 6. Further details of similar or alternative constructions of FIG. 8 are illustrated as FIG. 3 in the Appendix and described in the associated text therein. Further details of assembly 70b of FIG. 9 are illustrated in FIG. 7 of the Appendix and described in the associated text therein.

Referring to FIG. 8, details of an exemplary 5-layer IC metallization system 100 are depicted upon a CMOS semiconductor die 52. The illustrated metallization 100 may be utilized within the assemblies 70, 70a, 70b, 70c and in conjunction with packages 73, 73a, 73b, 73c (or other assembly and package configurations) although the metallization 100 of FIG. 8 is depicted with reference to assembly 70 and package 73. FIG. 8 depicts a cross-sectional view through planar MOSFET channel stripes and source and drain buss bar stripes of metallization 100 looking in an "X" direction. The depicted semiconductor die 52 includes a plurality of source\drain regions 101 and gate regions 102 therebetween to form plural MOSFETs 174. Source\drain regions 101 and gate regions 102 are preferably implemented as silicide regions, comprising polysilicide for example, formed adjacent to a surface 57 of substrate 56.

Semiconductor die 52 is coupled with an exemplary package 73. Electrical interconnects 84 comprise solder balls 87 having a bump pitch of 50–250 microns utilizing normal or fine bump pitch technology in exemplary configurations providing connectivity of die 52 and package 73. Further, an intermediate layer 74a is also depicted within package 73.

Metallization 100 includes plural metal layers including a first metal layer 110, a second metal layer 111, a third metal layer 112, a fourth metal layer 113 and a fifth metal layer 114 elevationally above surface 57 of semiconductive substrate 56. First metal layer 110 depicts source and drain "Y" stripes having dimensions of approximately 25 microns by 0.75 microns. Second metal layer 111 depicts source and drain "X" buss bars having dimensions of approximately 12 microns while portions corresponding to gate 102 have a dimension of 2.5 microns. Third metal layer 112 depicts a source plane with drain holes having dimensions of approximately 3 microns by 3 microns. Fourth metal layer 113 depicts a drain plane having source holes having dimensions of approximately 3 microns by 3 microns. Fifth metal layer 114 depicts a source and drain checkerboard configuration with ball pads comprising source pads 116 and drain pads 118.

Further details of metallization 100 of a 200 Ampere NMOS switching power transistor are discussed in the Appendix. Details of an exemplary metal layer 110 are discussed in the Appendix with reference to FIG. 4B and the associated text thereof. Further details of an exemplary metal layer 111 are discussed in the Appendix with reference to FIG. 4C and the associated text thereof. Further details of an exemplary metal layer 112 are discussed in the Appendix with reference to FIG. 4D and FIG. 5A and the associated text thereof. Further details of an exemplary metal layer 113 are discussed in the Appendix with reference to FIG. 5B and the associated text thereof. Further details of an exemplary metal layer 114 are discussed in the Appendix with reference to FIG. 5C and FIG. 5D and the associated text thereof.

The illustrated intermediate layer 74 comprising a fineline plated copper layer provides package solder bump drain and source contact pads 122. In the illustrated embodiment, layer 74 is spaced from substrate 56 comprising one or more power semiconductor switching device 50. As described previously, this space may be filled with insulative underfill material.

FIG. 8A depicts an illustrative representation of first and second metal layers 110, 111 looking in "Y" direction while FIG. 8 and FIG. 9 look in an "X" direction. Portion 117 of layer 111 comprises a drain buss bar while portion 119 of layer 111 comprises a source buss bar.

In an alternative embodiment to that illustrated in FIGS. 5, 6, 7 and 8, the intermediate layers may be fabricated on the semiconductor die 52a instead of within the package 73. Referring to FIG. 9, an alternative assembly 70b and package 73b are shown. Plural intermediate layers 74d, 74e are depicted formed upon semiconductor die 52a and metallization 100 including layers 110, 111, 112, 113 and 114a.

Layer 74d comprises portions electrically coupled with respective source bond pads 116 and drain bond pads 118 of metallization 114a. In FIG. 9 the area density or pitch of electrical couplings between the semiconductor die metallization 114a and the layer 74d need not be limited to the solder bump density, which allows much higher area array pad 116, 118 densities to be utilized (e.g., pad pitches of 40 microns or smaller, or 10,000 or more on a 4 mm×4 mm semiconductor die 52a), which substantially reduces the contribution of on-chip metallization 100 resistance to the overall chip plus package $R_{on}$. The tight mechanical coupling in FIG. 9 between the layers 74d, 74e and/or their associated dielectric layers 124a, 124 with the chip metallization 100 over substantially the complete area of the semiconductor die 52a in one possible embodiment is anticipated to offer improved robustness and potentially improved reliability over the fine-pitch solder bump approach of FIG. 7 or FIGS. 5, 6 and 8. BCB inter-layer dielectric 124 provides electrical insulation of source and drain electrical connections. Other patternable dielectric materials such as polyimide could be used here in place of BCB. Layer 74e comprises integrated circuit source bond pads 130 and drain bond pads 132 coupled with respective portions of layer 74d. Solder balls 87 are coupled with respective source bond pads 130 and drain bond pads 132. Solder balls 87 are additionally coupled with source solder pads 134 and drain solder pads 136 of an external package to provide electrical connectivity to the external package (only portions of one pair of pads 130, 132 and one pair of pads 134, 136 are shown in FIG. 9). Exemplary external packages include source and drain planes 76, 78 coupled with source and drain terminal contacts 80, 82 as described previously, or the package configuration 73c shown in FIG. 11. Other package configurations are possible which will, in their structure, incorporate pads 134, 136.

In an exemplary embodiment, fineline copper/polymer intermediate layers 74d, 74e are added to a completed or semi-fabricated semiconductor die 52a in a full-wafer process according to exemplary aspects of the present invention. Because of the very low sheet resistance of the fineline copper planes 74d and 74e, relatively coarse pitches may be utilized in joining the semiconductor die 52 to relatively heavy package metallization features without compromising ON resistance values ($R_{on}$). Such permits mating of semiconductor die 52 to relatively simple and commercially available packages using coarse-pitch solder bump, solder patch or other joining technologies.

Referring to FIG. 10, a lower surface of another arrangement of semiconductor die 52b is depicted in a flip-chip configuration comprising a plurality of solder balls 87 arranged in an array. As depicted, source pads of semiconductor die 52b and solder balls coupled therewith and drain pads of semiconductor die 52b and solder balls coupled therewith are depicted in alternating columns 140, 142, respectively.

A column 144 comprises both source solder balls (S), kelvin source and drain solder balls ($K_S$, $K_O$), temperature sensing diode solder balls ($D_P$, $D_N$), gate drive amplifier solder ball connections including ground ($V_{SS}$), input ($G_{in}$), and 2.5 Volts ($V_{DD}$) in one exemplary embodiment.

In an alternative embodiment, one or more columns of drain 142 or source 140 solder balls can be assigned to $V_{dd}$ in order to reduce the inductance and resistance of the $V_{dd}$ connection. This can be accommodated at the external contact level of FIG. 12 by running the metal layers contacting these $V_{dd}$ columns out the bottom direction in FIG. 12 (in which the source and drain are on the right and left sides), or the $V_{dd}$ contact might be extended to the right beyond the source contact region.

Figure 11:
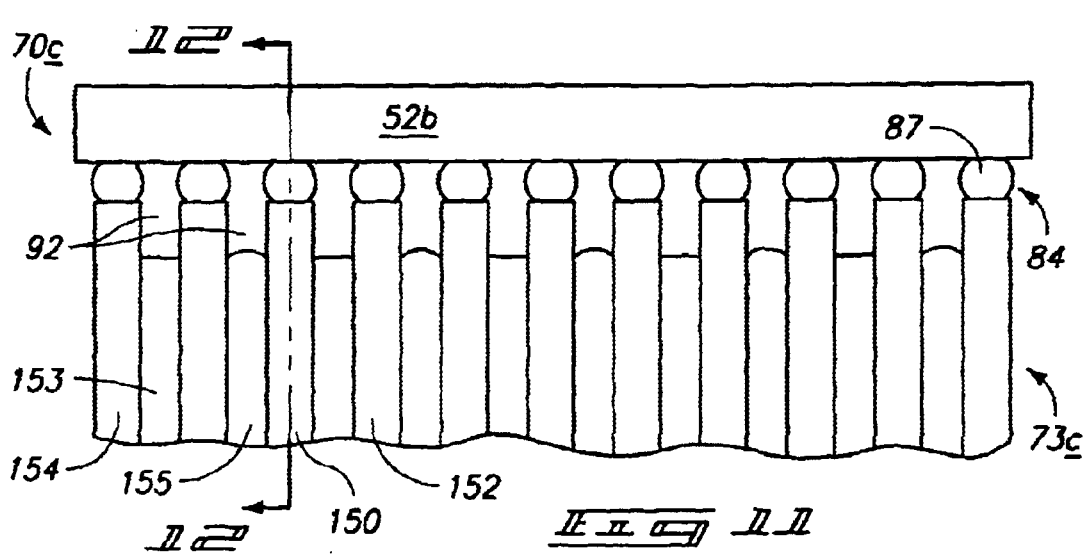
FIG. 11 is a side view of an exemplary integrated circuit assembly including the integrated circuit die of FIG. 10.

Referring to FIG. 11, an alternative package 73c of assembly 70c is depicted for coupling with electrical interconnects 84 comprising solder balls 87. Package 73c is implemented as a vertically laminate package comprising a plurality of conductive layers including source conductive layers 150 and drain conductive layers 152 in an alternating arrangement to couple with solder balls 87 of the flip-chip configuration of semiconductor die 52b shown in FIG. 10. Layer 154 corresponds to the column 144 of miscellaneous solder ball connections described above. Package 73c may also be utilized in conjunction with other die configurations, including the arrangements of semiconductor die 52 described above, and die 52a having intermediate layers 74 illustrated in FIG. 9. Other assembly configurations of dies and packages are possible.

Still referring again to FIG. 11, a plurality of alternating dielectric layers 153, 155 are provided intermediate appropriate conductive layers 150, 152, 154 as shown. In one convenient exemplary fabrication approach, dielectric layers 153 comprise PC board layers to which the conductive layers 150, 152 are bonded, while dielectric layers 155 comprise B-stage adhesive layers which are used to bond the various PC board layers together using, for example, the same type of lamination processes used to fabricate multilayer printed circuit boards. In FIG. 11 the metal layers are shown extending a substantial distance 92 above the extent of the circuit board and inter-board adhesive layers in the area where contact to the solder balls is made. Typically this "pullback" region 92 from which the PCB and inter-board adhesive layers are absent can be fabricated by means of an etching or other removal process after the vertical laminate package is fabricated. This form of embodiment of the invention is anticipated to offer potential benefits in reducing stress on the solder balls due to differential thermal expansion between the semiconductor die 52b and the package 73c by allowing the metal layers 150, 152 to bend in the lateral direction in FIG. 11. This beneficial mechanical compliance can be achieved in the opposite direction (that is, in the lateral direction in FIG. 12) by patterning, for example, suitably shaped vertical slots 93 in the source and drain metal planes 150, 152 between the solder ball contact areas, such that the solder ball contacts are made at the top of metal "towers" which have substantial freedom to bend.

Flip-chip mounting large silicon die directly to copper or thick PCB materials may cause severe reliability problems because of the large differences in CTE between the materials (Si=3 ppm/° C., Cu=16.6 ppm/° C., PCB=19 to 32 ppm/° C.) which fatigues and breaks solder balls on thermal cycling. In a typical PCB process, the metals are backed by a PCB dielectric. In one fabrication method, the structure as shown is originally fabricated with the PCB dielectrics going all of the way to the top. The PCB dielectrics are etched away or otherwise removed to provide flexible metal towers 95.

Referring to FIG. 12, vertical laminate package 73c is illustrated in a side view coupled with semiconductor die 52b and electrical interconnects 84. A source layer 150, shown in solid outline, is coupled with electrical interconnects 84 comprising source solder balls and extends to the right to provide source terminal 80a. A drain conductive layer 152 is depicted extending in an opposite direction from source conductive layer 150 to provide drain terminal 82a. Both source 150 and drain 152 layers may be patterned with vertical slots 93 or other suitable compliance patterning features between solder balls to achieve lateral compliance, particularly when used in conjunction with the pullback 92 of the PCB and inter-layer dielectrics from the ends of the conductor towers 95 on which solder ball contact is made. Suitable electrically insulative underfill material, not shown in FIG. 12, may be provided intermediate die 52*b* and package 73*c*.

A vertical laminate package 73*c* provides ultra-low ON resistance ($R_{on}$) performance. As shown in FIG. 12, orientation of alternating conductive metal layers 150, 152 in a laminate stack perpendicular to a surface of semiconductor die 52*b* permits very large reductions in package metal resistance by extending the package structure vertically. Package 73*c* depicted in FIG. 12 may be utilized by providing electrical interconnects 84 directly upon semiconductor die 52 (e.g., flip chip arrangement) or with the utilization of additive fineline metallization layers 74*d*, 74*e* upon semiconductor die 52*a* as described above in the exemplary configuration of FIG. 9.

Packaging concepts described herein provide high current conduction while also taking advantage of low $R_{on}$ capabilities of deep submicron lateral MOSFET devices realized not only at the semiconductor device level but also at the packaged device level. Currents applied to individual power semiconductor switching devices 50 are divided into a large number of parallel paths with increasing metallization or other conductor thicknesses as the number of paths decreases. For example, it has been demonstrated that 250,000 individual MOSFET source and drain electrodes are coupled with 256 solder ball contacts through the utilization of layers of metallization 100 described above upon semiconductor die 52. The packaging coupled with the semiconductor die further reduces the number of contacts from 256 in the given example to a single source terminal contact and a single drain terminal contact comprising high current package leads.

Referring to FIG. 13, details regarding exemplary transistors 174 utilized to form an exemplary power semiconductor switching device 50 are illustrated. As described above, aspects of the present invention provide power semiconductor switching device 50 comprising a plurality of transistors 174 coupled in parallel to conduct the large currents (1–1000 Amperes) typically experienced in power applications. The number of transistors 174 provided to form a single device 50 is varied depending upon the particular application of power semiconductor switching device 50 and the magnitude of currents to be switched. Six n-channel transistors 174 are depicted in FIG. 13 for discussion purposes.

Semiconductor die 52 includes transistors 174 fabricated using deep submicron CMOS integrated circuit processes according to exemplary aspects of the present invention. CMOS integrated circuit metallization layers (FIG. 8 and FIG. 9) are provided upon die 52 and are optimally patterned for distributing high currents with low resistance and maximum current handling capability as described previously in exemplary embodiments.

The present invention provides planar high-current ($i_{max}$=1 to 1000 Amperes) switching MOSFET devices having very low ON resistance ($R_{on}$=10 micro ohms to 1 milliohm typical) and relatively low gate drive power requirements for very high efficiency in low voltage power conversion applications. As described above, the planar device structure of transistors 174 comprising power semiconductor switching device 50 provides structures wherein current flows between closely spaced (e.g., 0.1 to 0.5 microns) source and drain electrodes on the same (top) surface of the semiconductor die 52. Accordingly, aspects of the present invention provide devices 50 comprising high current, low $R_{on}$ parallel-coupled MOSFETs fabricated upon a relatively small semiconductor die 52 using submicron to deep submicron CMOS integrated circuit foundry processes.

FIG. 13 depicts a portion of the exemplary power semiconductor switching device 50 comprising plural planar, horizontal geometry high current switching MOSFET devices implemented in a CMOS process. Power semiconductor switching device 50 is fabricated within a monolithic semiconductive substrate 56, such as silicon, comprising die 52.

Portions of substrate 56 are formed to comprise p-type substrate material 168 or p-wells in which to form n-channel devices 174. In addition, other portions of substrate 56 may be n-type doped to form n wells 170 to enable the formation of p-channel devices 175 if desired. An inter-layer dielectric-filled trench region 172 is typically provided for lateral electrical isolation of n wells 170 from p-type substrate material or p wells 168.

First metal layer 110 of metallization 100 is depicted in FIG. 13 comprising source electrodes 160 and drain electrodes 162 coupled with respective source\diffusion regions 161, 163 which correspond to diffusion regions 101. Gate electrodes 164 are provided intermediate opposing source and drain electrodes 160, 162 and insulated from the semiconductor by a thin gate oxide to form n-channel transistors 174.

A plurality of source regions 161 and drain regions 163 are formed in p-type substrate 168 for the formation of n-channel devices 174. Regions 161, 163 are doped with an n-type dopant to form n+ source and drain regions in the exemplary embodiment. A polysilicide layer 165 may be provided intermediate electrodes 160, 162 and respective diffusion regions 161, 163 in one embodiment to minimize resistances therebetween. In FIG. 13, the via conductors 173 between the first level metal 110 and the polysilicide layer 165 are shown as part of the source electrodes 160 and drain electrodes 162. Gate electrodes 164 individually comprise polysilicide in one embodiment which are configured to couple with layers of metallization 100. As utilized herein, the term "source" refers to structures including electrically conductive structures proximately coupled with a source of the power transistor and including source contact 160 and/or source region 161 for example and the term "drain" refers to structures including electrically conductive structures proximately coupled with a drain of the power transistor and including drain contact 162 and/or drain region 163 for example.

Source and drain regions 161, 163 are individually utilized to form a plurality of adjacent transistors 174 in the depicted exemplary embodiment. For example, a given source electrode 160 and source region 161 are utilized to form a transistor 174 with the drain electrode 162 and drain region 163 to the right as well as being utilized in combination with the drain electrode 162 and drain region 163 to the left of the given source electrode 160 to form another transistor device 174. Accordingly, in a power device 50 configured according to this exemplary aspect and having x number of transistors 174 coupled in parallel, x gates 164, x/2 source electrodes 160 and x/2 drain electrodes 162 are utilized.

As depicted, semiconductive substrate 56 has a surface 57. Source electrode 160, source region 161, drain electrode 162, drain region 163 and gate electrode 164 are formed adjacent to surface 57 in the depicted embodiment according to the horizontal planar configuration of CMOS-implemented transistors 174.

Source regions 161 may be connected with the p-wells in order to avoid or minimize potential problems with floating p-wells at excessive dV/dt occurrences. Other configurations of transistors 174 are possible.

Power semiconductor switching devices 50 individually comprise a plurality of planar horizontally configured submicron MOSFET transistors 174 individually including a source electrode 160, drain electrode 162, and gate electrode 164. According to one exemplary embodiment, a single power semiconductor switching device 50 comprises 500,000 or more transistors 174 coupled in parallel to provide a low voltage, high current power device 50. In such an embodiment, source electrodes 160 of transistors 174 are coupled in parallel, drain electrodes 162 are coupled in parallel and gate electrodes 164 are coupled in parallel. Provision of parallel coupled n-channel devices 174 enables power device 50 to conduct currents in excess of one Ampere. An exemplary device 50 comprising 500,000 transistors 174 coupled in parallel on a 4 mm×4 mm silicon die 52 enables conduction of currents up to approximately 200 Amperes.

The number of transistors 174 implemented within a given device 50 varies depending upon the application or implementation of device 50, as well as the width selected for the individual transistors to be paralleled (taken as 25 microns for the examples cited herein). The current handling capability, die size and $R_{on}$ values for a device 50 vary corresponding to the numbers of transistors 174 utilized. For example, a very small semiconductor die 52 having an approximate area of 0.16 mm² provides approximately 5,000 parallel-coupled transistors 174 which conduct currents of approximately 2 Amperes with an $R_{on}$ of approximately 0.01–0.02 Ohms (inclusive of n-channel MOSFET ON resistance and on-chip metallization resistance, but not including package resistance), while a die of 1.6 mm² provides approximately 50,000 parallel-coupled transistors 174 enabling conduction of currents of approximately 20 Amperes with an $R_{on}$ of approximately 0.001–0.002 Ohms, and a die area of 16 mm² provides approximately 500,000 parallel-coupled transistors 174 which enables conduction of currents of approximate 200 Amperes with an $R_{on}$ of approximately 0.0001–0.0002 Ohms, and a die area of 80 mm² provides approximately 2,500,000 parallel-coupled transistors 174 which conduct currents of approximately 1000 Amperes with an $R_{on}$ of approximately 0.00004–0.00008 Ohms. Further details of FIG. 13 are discussed in the Appendix with reference to FIG. 1B and the associated text thereof.

FIG. 14 depicts an elevational plan view of a region of an exemplary semiconductor die 50 illustrating n-channel transistors 174 forming power semiconductor switching device 50. The illustrated region includes a plurality of rows 176 individually including a plurality of transistors 174. The number of rows 176 is varied and the number of transistors 174 within a row 176 is varied depending upon the implementation of device 50, the magnitude of currents to be conducted and desired $R_{on}$ values. In one exemplary implementation of power device 50 having a row 176 height of 25 microns (corresponding to the width of each of the individual transistors), 500,000 transistors 174, 250,000 source regions 161, 250,000 drain regions 163 and 500,000 gates 164 are provided in a 4 mm×4 mm (16 mm²) die size as implemented in a nominal 0.24 micron feature size CMOS process. The $R_{on}$ and number of transistors in a given die size are typically closely tied to the IC feature size. The number of transistors also depends on the selection of row height.

FIG. 14 depicts transistors 174 upon surface 57 of substrate 56 (FIG. 13). Source regions 161, drain regions 163 and gates 164 include polysilicide 165 (FIG. 13). A plurality of via conductors 173 are provided upon respective source regions 161 and drain regions 163 and via conductors 177 are provided upon gates 164 to provide vertical connectivity to first metal layer 110 elevationally over substrate 56 as shown in FIG. 8 and FIG. 9, for example.

Individual rows 176 provide transistors 174 individually having a channel length of approximately 25 microns. In an exemplary nominal 0.24 micron feature size commercial CMOS process using aluminum metallization, individual rows 176 provide W=250 microns of NFET width in a 10 micron horizontal distance. Polysilicide 165 (FIG. 13) comprising source regions 161 and drain regions 163 provides ohmic contacts of 4 Ohms/Sq. Via conductors 173, 177 provide 7.5 Ohms/cut to reduce current path resistance. Polysilicide comprising gate 164 provides an ohmic contact of 7 Ohms/Sq. In the described exemplary configuration, metal layers 110, 111, 112 and 113 (FIG. 8 or FIG. 9) have sheet resistances of 0.08 Ohms/Sq., while the top metal layer 114 has a sheet resistance of 0.04 Ohms/Sq., with a via resistance of 5 Ohms/cut between all metal layers. Other constructions of transistors 174 and connections to transistors 174 are possible. In particular, the $R_{on}$ and current carrying capacity of the devices could be improved if a CMOS or other IC process using copper, rather than aluminum, metallization is used for fabrication. Further details regarding substantially similar or alternative constructions of FIG. 14 are discussed in the Appendix with reference to FIG. 4A and the associated text thereof.

Referring to FIG. 15, power semiconductor switching device 50 is illustrated as a power transistor having source terminal contact 80, drain terminal contact 82 and a gate electrode 83. Power semiconductor switching device 50 is coupled with an exemplary gate driver amplifier 180 utilized to drive the gate electrode of power device 50 coupled with a plurality of parallel-coupled gates of transistors 174. Amplifier 180 is one exemplary configuration of amplifiers 60 described above. More specifically, gate driver amplifier 180 may be implemented as auxiliary circuitry 54 upon semiconductor die 52 in one configuration as described above and corresponding to amplifiers 60 of FIG. 4.

The illustrated exemplary gate driver amplifier 180 includes a first stage 182 and a second stage 184. First driver stage 182 includes a p-channel device 186 wherein $W_{d1p}$=2 mm and an n-channel device 188 wherein $W_{d1n}$=1 mm. Second driver stage 184 includes a p-channel device 190 wherein $W_{d2p}$=100 mm and an n-channel device 192 having $W_{d2n}$=50 mm.

An input node 193 is configured to receive control signals from an appropriate source, such as power converter controller 38, in one embodiment. In the configuration wherein power semiconductor switching device 50 comprises 540,000 n-channel devices an input capacitance at node 193 is approximately 4.5 pF. At a node 194 intermediate first stage 182 and second stage 184, a capacitance of approximately 225 pF is present. Node 195 of second driver stage 184 is coupled with gate terminal 83 of power semiconductor switching device 50 where a capacitance of approximately 20 nF is present.

Power semiconductor switching device 50 comprising 540,000 transistors 174 coupled in parallel provides $W_n$=13,500 mm. Power semiconductor switching device 50 conducts currents of 200 Amperes in the depicted embodiment with a 5 mm×5 mm die size and can accommodate currents of 1000 Amperes if the switching device, amplifier and die size are scaled up to a 10 mm×10 mm die size. In the exemplary 0.24micron CMOS process, $V_{DD}$ is approximately 2.5 Volts and $V_{SS}$ ground in the illustrated arrangement, assuming the source terminal 80 to be near ground potential as used in FIGS. 3 and 4.

According to certain aspects of the invention, a bypass capacitor 200 is coupled with the source of power semiconductor switching device 50 and $V_{DD}$. Bypass capacitor 200 is greater than or equal to 20 nF in the depicted exemplary embodiment. Bypass capacitor 200 is configured to provide adequate pulse current to charge a capacitance of the gates of paralleled coupled transistors 174 of power semiconductor switching device 50 responsive to control signals received via input 193.

In one embodiment of this invention, bypass capacitor 200 is implemented monolithically on a CMOS chip using gate to channel capacitance of a large number of large gatelength (e.g., $L_g$=10 microns) n-channel MOSFETs in parallel with their common gate electrode connected to $V_{dd}$ 184 and their source and drain electrodes connected to the output source electrode 80.

In addition, connecting the source of n-channel device 192 with the source of power semiconductor switching device 50 obviates a need for a separate body diode inasmuch as power semiconductor switching device 50 turns on if the drain 82 thereof becomes substantially more negative than the source 80. Alternative body diode configurations are described below. Further details of the exemplary circuitry of FIG. 15 are described below with reference to FIG. 8 of the Appendix and the associated text of the Appendix.

Referring to FIG. 16, power semiconductor switching device 50 is depicted coupled with an active diode connected p-channel MOSFET 202. The drain 206 and gate 208 of the p-channel MOSFET 202 are connected as illustrated to provide a body diode circuit turning on when the drain 206 becomes more negative than the source 204 by an amount greater than the threshold voltage $V_t$ of transistor 202. As opposed to a conventional prior art vertical geometry power MOSFET of FIG. 1 and 2 in which the diffusion stored charge, $Q_d$ in the body diode 7 can be very large, and a serious limitation to switching speed and efficiency, the stored charge in exemplary devices 50 according to aspects of this invention (e.g., FIG. 16) is very small, principally that stored in the gate capacitance of the switching device 50.

If the gate 83 of power semiconductor switching device 50 is constrained to go no more negative than the source 80, it inherently acts as a body diode and transistor 202 may be omitted if desired. As a consequence, with the gate driver amplifier configuration of FIG. 15, in which the voltage at the gate terminal 83 of the switching device 50 is constrained to go no more negative than that at its source 80, this n-channel MOSFET active body diode is obtained automatically in the switching device 50. For this exemplary device 50, the stored charge that is removed in switching from a 200 Ampere active body diode current (typically at $V_{ds}$=−0.75 Volts) to $V_{ds}$=0 Volts is less than about 15 nanoCoulombs, which is far less than for conventional prior art vertical geometry power MOSFET devices (FIGS. 1 and 2). Alternatively, device 202 is implemented as an n-channel MOSFET in another embodiment with the gate 208 thereof connected to the source 204 thereof to also serve as an active body diode circuit. Body diode circuit implementations are coupled with the source 80 and drain 82 of the power semiconductor switching device 50 in the depicted embodiment to conduct free wheeling currents which may be present within power converter 10 during switching operations or present during operations in other applications. Further details of FIG. 16 are discussed in the Appendix with reference to FIG. 2B and the associated text thereof. Other circuit configurations to conduct free wheeling currents are possible.

Aspects of the present invention provide a plurality of planar, horizontally configured MOSFET devices 174 configured to form a power semiconductor switching device 50 having contacts including a high-current source terminal contact 80 and high-current drain terminal contact 82 on a common surface 57 of a semiconductor die 52. Additional aspects enable electrical connectivity of terminal contacts 80, 82 to devices provided upon the common surface 57 of semiconductor die 52 using convenient package configurations. Other aspects of the invention are contemplated and provided, some of which are described above and in the attached Appendix, the contents of which are incorporated herein by reference.

For comparison purposes, power semiconductor switching devices 50 configured according to exemplary aspects of the present invention including an exemplary 0.24 micron feature size (0.19 micron $L_{eff}$) CMOS process are discussed below with respect to a conventional vertical power MOSFET (FIG. 1) having equivalent ON resistance $R_{on}$ values. Power semiconductor switching devices 50 of some aspects of the invention have twenty four times smaller die area than conventional vertical arrangements, approximately thirty times less gate capacitance, 478 times lower gate drive power at a given frequency ($P_{gate}/f_{clock}$), and the exemplary semiconductor die configurations described herein may be fabricated by a standard CMOS integrated circuit foundry if desired as opposed to processes to form vertical conventional configurations.

FIG. 17–FIG. 19 depict respective graphical representations 240, 250, 260 of electrical performance characteristics of an exemplary power semiconductor switching device 50 which embodies aspects of the present invention. The graphed power device 50 comprises a 200 Ampere power device 50 having 514,000 n-channel MOSFETs 174 providing W=12,850,000 microns and $L_{eff}$=0.19 microns.

FIG. 17 depicts drain currents of the exemplary power device 50 for values of $V_{GS}$=0.5–2.5 Volts in 0.5 Volt increments over its nominal 0 to 2.5 Volt drain voltage range and over an $I_d$=0 to 8000 Ampere range high enough to include its $I_{dss}$=7700 Ampere saturated drain current at $V_{gs}$=+2.5 Volt value. Note that sustained operation at high values of drain currents (e.g., above 200 Amperes) may not be possible because of metal migration reliability issues, and operation at combinations of high drain voltages and drain currents should be kept of short duration because of thermal power dissipation and energy absorption limitations.

FIG. 18 depicts drain currents of the exemplary power device 50 for values of $V_{GS}$=0.45–0.7 Volts in 0.05 Volt increments over its nominal 0 to 2.5 Volt drain voltage range and over the $I_d$=0 to 200 Ampere range within which sustained operation is specified (subject to power dissipation and energy absorption limitations).

FIG. 19 depicts drain currents for a $V_{GS}$ value of 2.5 Volts over the $I_d$=0 to 200 Ampere range within which sustained operation is specified and over the 0 to 0.05 Volt drain voltage range within which sustained operation is normally seen for a device of this size when the device is ON (Vgs=+2.5 Volts) in the exemplary power conversion applications of the type illustrated in FIGS. 3 and 4.

Reference 262 of FIG. 19 depicts, at any given drain current within transistors 174 of an exemplary power device 50, the voltage drop, $V_{ds}$, measured from the transistor drain contact 163 to source contact 161 in FIG. 13 assuming approximately equal sharing of total current $I_d$ between all transistors 174. The slope of this line is the $R_{on}$ of the transistor devices 174 themselves, exclusive of on-chip or package metal resistance.

Reference 264 depicts, at any given drain current, the voltage drop, $V_{ds}$, measured from the chip drain pads 118 to source pads 116 in FIG. 8, assuming approximately equal sharing of total current $I_d$ between all source 116 and drain 117 pads. The slope of this line is the $R_{on}$ of the transistor devices 174 themselves plus that of the on-chip metallization 100 for the case of a 4 mm×4 mm die having a total of 256 solder balls, exclusive of package metal resistance.

Reference 266 depicts at any given drain current, the voltage drop, $V_{ds}$, measured from the package drain contact 82 to package source contact 80 in FIGS. 5 and 6, assuming uniform distribution of current across the width of these package contacts 80, 82, for the case of a 4 mm×4 mm die having a total of 256 solder balls and the package metallization thicknesses discussed in conjunction with FIGS. 5 and 6, and in Appendix A. The slope of this line is the total $R_{on}$ of the packaged transistor inclusive of the transistor devices 174 themselves plus that of the on-chip metallization 100 and the package metal resistance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An integrated circuit assembly comprising:
   a semiconductive substrate comprising a plurality of field effect transistors having electrically coupled sources and electrically coupled drains comprising regions of the substrate adjacent to a surface of the substrate, and wherein the electrically coupled sources and the electrically coupled drains are collectively configured to conduct power currents in excess of one Ampere;
   a package having a plurality of source contacts and a plurality of drain contacts configured to couple with the electrically coupled sources and the electrically coupled drains of the semiconductive substrate, and wherein the source contacts and the drain contacts are provided adjacent to a surface of the package;
   at least one metallization layer coupled with the substrate and configured to couple at least some of the sources in parallel and at least some of the drains in parallel; and
   wherein the semiconductive substrate further comprises a horizontal interconnect layer formed upon and coupled with the at least one metallization layer, and the horizontal interconnect layer defines a plurality of source contacts and a plurality of drain contacts configured to couple with respective ones of the source contacts and the drain contacts of the package.

2. The assembly of claim 1 wherein the semiconductive substrate further comprises a plurality of source contacts and a plurality of drain contacts coupled with respective ones of the sources and the drains of the field effect transistors, and wherein the source contacts and the drain contacts of the package are configured to couple with respective ones of the source contacts and the drain contracts of the semiconductor substrate.

3. The assembly of claim 1 wherein the package comprises at least one horizontal interconnect layer to provide the source contacts and the drain contacts.

4. The assembly of claim 1 wherein all electrical connections intermediate the sources and the drains of the substrate and the source contacts and the drain contacts of the package pass through the surface of the substrate.

5. The assembly of claim 1 wherein the package includes one terminal source contact and one terminal drain contact electrically coupled with respective ones of the source contacts and the drain contacts of the package and adapted to electrically couple with devices external of the integrated circuit assembly.

6. The assembly of claim 5 wherein the package provides a plurality of electrical paths intermediate the one terminal source contact and the one terminal drain contact and respective ones of the source contacts and the drain contacts of the package, and the electrical paths individually have a resistance less than 1 milliOhm.

7. The assembly of claim 1 wherein the semiconductive substrate comprises a flip chip semiconductive die.

8. The assembly of claim 1 further comprising a plurality of source electrical interconnects and a plurality of drain electrical interconnects coupled with respective ones of the sources and drains and arranged in alternating columns, and wherein the package comprises a plurality of conductive layers corresponding to respective ones of the columns.

9. The assembly of claim 1 wherein the package comprises at least one horizontal interconnect layer.

10. The assembly of claim 1 wherein the number of source contacts of the package is less than the number of sources and the number of drain contacts of the package is less than the number of drains.

11. The assembly of claim 1 wherein the semiconductive substrate comprises a monolithic substrate including the field effect transistors and auxiliary circuitry.

12. The assembly of claim 1 wherein the semiconductive substrate comprises a monolithic substrate including the field effect transistors and auxiliary circuitry coupled with the plurality of field effect transistors.

13. The assembly of claim 1 wherein the field effect transistors comprise MOSFET devices.

14. An integrated circuit assembly comprising:
    a power semiconductor device comprising:
       a semiconductive substrate having a surface; and
       a power transistor formed using the substrate and having a plurality of source contacts and drain contacts adjacent to and over substantially an entirety of the surface and configured to conduct power currents;
    a package having a plurality of source contacts and a plurality of drain contacts corresponding to and electrically coupled with respective ones of the source contacts and the drain contacts of the power semiconductor device;
    at least one metallization layer coupled with the substrate and configured to couple at least some of the source contacts in parallel and at least some of the drain contacts in parallel; and
    a horizontal interconnect layer formed upon and coupled with the at least one metallization layer, and the horizontal interconnect layer defines the source contacts and the drain contacts of the power transistor.

15. The assembly of claim 14 wherein the power transistor comprises a plurality of planar field effect transistors.

16. The assembly of claim 14 wherein the power transistor comprises a plurality of planar field effect transistors coupled in parallel.

17. The assembly of claim 14 wherein the package comprises at least one horizontal interconnect layer to provide the source contacts and the drain contacts of the package.

18. The assembly of claim 14 wherein all electrical connections intermediate the source contacts and the drain contacts of the substrate and the source contacts and the drain contacts of the package pass through the surface of the substrate.

19. The assembly of claim 14 wherein the power transistor is configured to conduct power currents in excess of one Ampere.

20. The assembly of claim 14 wherein the package includes one terminal source contact and one terminal drain contact electrically coupled with respective ones of the source contacts and the drain contacts of the package and adapted to electrically couple with devices external of the semiconductor switching device.

21. The assembly of claim 20 wherein the package provides a plurality of electrical paths intermediate the one terminal source contact and the one terminal drain contact and respective ones of the source contacts and the drain contacts of the package, and the electrical paths individually have a resistance less than 1 milliOhm.

22. The assembly of claim 14 wherein the semiconductive substrate comprises a flip chip semiconductive die.

23. The assembly of claim 14 wherein the source contacts and the drain contacts of the power semiconductor device are arranged in alternating columns, and wherein the package comprises a vertical laminate package comprising a plurality of conductive layers corresponding to respective ones of the columns.

24. The assembly of claim 14 wherein the package comprises at least one horizontal interconnect layer.

25. The assembly of claim 24 wherein the at least one horizontal interconnect layer is spaced from the power semiconductor device; and further comprising a plurality of electrical interconnects intermediate the horizontal interconnect layer of the package and the source contacts and the drain contacts of the power semiconductor device.

26. The assembly of claim 14 wherein the semiconductive substrate comprises a monolithic substrate including a plurality of field effect transistors and auxiliary circuitry.

27. The assembly of claim 14 wherein the semiconductive substrate comprises a monolithic substrate including the field effect transistors and auxiliary circuitry coupled with the plurality of field effect transistors.

28. The assembly of claim 14 wherein the power transistor comprises a plurality of MOSFET devices.

29. The assembly of claim 1 further comprising a plurality of source contacts and drain contacts which cover substantially an entirety of the surface of the substrate.

30. The assembly of claim 1 further comprising a plurality of source contacts and drain contacts positioned over substantially an entirety of the surface of the substrate.

31. The assembly of claim 1 wherein the source contacts and the drain contacts are arranged in a checkerboard pattern.

32. The assembly of claim 1 wherein the source contacts and the drain contacts are arranged in a plurality of respective columns.

33. The assembly of claim 1 further comprising a plurality of source contacts and drain contacts of the semiconductive substrate and arranged in a plurality of respective columns which extend from one end of the semiconductive substrate to an other end of the semiconductive substrate.

34. The assembly of claim 1 wherein the transistors of the semiconductive substrate are configured to conduct currents of about 20 Amperes, or more.

35. The assembly of claim 1 wherein the transistors of the semiconductive substrate are configured to conduct currents of about 100 Amperes, or more.

36. The assembly of claim 1 wherein the transistors of the semiconductive substrate are configured to conduct currents of about 200 Amperes, or more.

37. The assembly of claim 36 wherein the semiconductive substrate has an area of about 4 mm×4 mm, or less.

38. The assembly of claim 37 wherein the source contacts are coupled with a source terminal contact and the drain contacts are coupled with a drain terminal contact, and an on resistance of about 300 microOhms, or less, is provided intermediate the source terminal contact and the drain terminal contact.

39. The assembly of claim 1 wherein the source and the drain contacts are individually spaced a substantially uniform distance from adjacent ones of the source and the drain contacts in horizontal and vertical directions.

40. The assembly of claim 39 wherein the source and the drain contacts have a pitch of about 250 microns, or less.

41. The assembly of claim 39 wherein the source and the drain contacts have a pitch of about 100 microns, or less.

42. The assembly of claim 1 wherein the semiconductive substrate supports a plurality of source and drain pads coupled with respective ones of the sources and the drains and having a pad pitch of less than or equal to about 40 microns in one of vertical and horizontal directions of the source and drain pads.

43. The assembly of claim 42 wherein the semiconductive substrate supports an intermediate layer configured to electrically couple the source and drain pads with the source contacts and the drain contacts of the package.

44. The assembly of claim 8 wherein the conductive layers are individually electrically coupled with more than one of the electrical interconnects.

45. The assembly of claim 1 wherein the package includes one terminal source contact and one terminal drain contact electrically coupled with respective ones of the source contacts and the drain contacts, and an electrical path intermediate the one terminal source contact and the one terminal drain contact has a resistance of 300 microOhms, or less.

46. The assembly of claim 45 wherein the electrical path is configured to conduct currents in the range of 100–200 Amperes.

47. The assembly of claim 1 wherein the horizontal interconnect layer comprises a copper plane.

48. The assembly of claim 1 wherein the horizontal interconnect layer permits usage of a plurality of pads defined by the at least one metallization layer having an increased density compared with a denisty of the source contacts and the drain contacts of the package.

49. An integrated circuit assembly comprising:
   a semiconductive substrate comprising a plurality of field effect transistors having electrically coupled sources and electrically coupled drains comprising regions of the substrate adjacent to a surface of the substrate, and wherein the electrically coupled sources and the electrically coupled drains are collectively configured to conduct power currents in excess of one Ampere;
   a package having a plurality of source contacts and a plurality of drain contacts configured to couple with the electrically coupled sources and the electrically coupled drains of the semiconductive substrate, and wherein the source contacts and the drain contacts are provided adjacent to a surface of the package; and a plurality of source electrical interconnects and a plurality of drain electrical interconnects coupled with respective ones of the sources and drains and arranged in alternating columns, and wherein the package comprises a vertical laminate package comprising a plurality of conductive layers corresponding to respective ones of the columns.

50. An integrated circuit assembly comprising:

a semiconductive substrate comprising a plurality of field effect transistors having electrically coupled sources and electrically coupled drains comprising regions of the substrate adjacent to a surface of the substrate, and wherein the electrically coupled sources and the electrically coupled drains are collectively configured to conduct power currents in excess of one Ampere;

a package having a plurality of source contacts and a plurality of drain contacts configured to couple with the electrically coupled sources and the electrically coupled drains of the semiconductive substrate, and wherein the source contacts and the drain contacts are provided adjacent to a surface of the package; and wherein the source contacts and the drain contacts are arranged in a checkerboard pattern.

* * * * *

UNITED STATES PATENT AND TRADEMARK OFFICE
CERTIFICATE OF CORRECTION

PATENT NO. : 6,710,441 B2
DATED : March 23, 2004
INVENTOR(S) : Richard C. Eden et al.

It is certified that error appears in the above-identified patent and that said Letters Patent is hereby corrected as shown below:

Column 2,
Line 6, please delete "3/" after "insulator" and insert -- 3I --.
Line 7, please delete "2/" after "insulator" and insert -- 2I --.
Line 28, please delete "p-n$^-$-n$^{30}$" after "current" and insert -- p-n$^-$-n$^+$ --.
Line 31, please delete "j$_t$" after "current" and insert -- i$_r$ --.
Line 32, please delete "t$_r$=Q$_d$/j$_t$" after "current" and insert -- t$_r$=Q$_d$/i$_r$ --.

Column 4,
Line 57, please delete "in" before "the" and insert -- In --.

Column 13,
Line 57, please delete "(K$_s$K$_o$)" after "balls" and insert -- (K$_S$K$_D$) --.

Signed and Sealed this

Sixteenth Day of November, 2004

JON W. DUDAS
*Director of the United States Patent and Trademark Office*